US012684734B2

(12) United States Patent
Chang

(10) Patent No.: US 12,684,734 B2
(45) Date of Patent: Jul. 14, 2026

(54) IMMERSION COOLING SYSTEM FOR INTEGRATED CIRCUIT

(71) Applicant: Taiwan Semiconductor Manufacturing Company, Ltd., Hsinchu (TW)

(72) Inventor: Jen-Yuan Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 122 days.

(21) Appl. No.: 18/151,322

(22) Filed: Jan. 6, 2023

(65) Prior Publication Data

US 2024/0049427 A1 Feb. 8, 2024

Related U.S. Application Data

(60) Provisional application No. 63/413,715, filed on Oct. 6, 2022, provisional application No. 63/394,802, filed on Aug. 3, 2022.

(51) Int. Cl.
| | |
|---|---|
| *H05K 7/20* | (2006.01) |
| *F25B 9/00* | (2006.01) |
| *H10W 40/30* | (2026.01) |
| *H10W 40/47* | (2026.01) |

(52) U.S. Cl.
CPC ............ *H05K 7/203* (2013.01); *H10W 40/30* (2026.01); *F25B 9/002* (2013.01); *H05K 7/20318* (2013.01); *H05K 7/20327* (2013.01);

*H05K 7/20354* (2013.01); *H05K 7/20381* (2013.01); *H05K 7/20818* (2013.01); *H10W 40/47* (2026.01)

(58) Field of Classification Search
CPC .............. H05K 7/203; H05K 7/20318; H05K 7/20327; H05K 7/20354; H05K 7/20381; H05K 7/20818; H10W 40/30–305
See application file for complete search history.

(56) References Cited

U.S. PATENT DOCUMENTS

| | | | | | |
|---|---|---|---|---|---|
| 3,766,977 | A | * | 10/1973 | Pravda | H01L 24/72 |
| | | | | | 165/47 |
| 3,817,321 | A | * | 6/1974 | Von Cube | H01L 24/01 |
| | | | | | 165/170 |
| 4,773,234 | A | * | 9/1988 | Kann | F25B 40/00 |
| | | | | | 62/509 |
| 5,002,123 | A | * | 3/1991 | Nelson | F28F 13/08 |
| | | | | | 257/E23.098 |
| 5,297,621 | A | * | 3/1994 | Taraci | H05K 7/203 |
| | | | | | 324/750.08 |

(Continued)

FOREIGN PATENT DOCUMENTS

| | | |
|---|---|---|
| KR | 20090120082 A | 11/2009 |
| KR | 20200022487 A | 3/2020 |

*Primary Examiner* — Zachary Pape
(74) *Attorney, Agent, or Firm* — HAYNES AND BOONE, LLP

(57) ABSTRACT

Cooling systems for integrated circuit devices are provided. A cooling system according to the present disclosure includes a coolant tank containing a coolant, a cooling coil disposed within the coolant tank, a refrigerant circulating in the cooling coil, and a circulation pump disposed in the coolant tank and configured to circulate the coolant within the coolant tank.

20 Claims, 23 Drawing Sheets

(56)     References Cited

U.S. PATENT DOCUMENTS

| | | | | |
|---|---|---|---|---|
| 8,913,383 | B1 * | 12/2014 | Goldsmith | H05K 7/2039 |
| | | | | 361/708 |
| 9,881,862 | B1 * | 1/2018 | Otremba | H01L 23/49861 |
| 10,251,305 | B2 * | 4/2019 | Seväkivi | H01L 25/115 |
| 10,939,580 | B2 * | 3/2021 | Gao | G06F 1/206 |
| 11,172,593 | B2 * | 11/2021 | Tian | H05K 7/20236 |
| 12,400,932 | B2 * | 8/2025 | Asai | H01L 24/48 |
| 2013/0291529 | A1 | 11/2013 | Stahlkopf | |
| 2014/0204550 | A1 * | 7/2014 | Kataoka | H05K 3/284 |
| | | | | 361/765 |
| 2014/0321053 | A1 * | 10/2014 | Donnelly | H01L 23/467 |
| | | | | 361/691 |
| 2015/0115377 | A1 * | 4/2015 | DeNatale | G01C 19/5712 |
| | | | | 438/51 |
| 2017/0064862 | A1 | 3/2017 | Miyoshi | |
| 2018/0070477 | A1 * | 3/2018 | Saito | H01L 23/473 |
| 2020/0093038 | A1 | 3/2020 | Enright | |
| 2020/0315055 | A1 | 10/2020 | Tian | |
| 2020/0315059 | A1 | 10/2020 | Gao | |
| 2021/0102294 | A1 * | 4/2021 | Miljkovic | C23C 14/5853 |
| 2023/0129242 | A1 * | 4/2023 | Zou | F25B 41/22 |
| | | | | 62/324.6 |
| 2024/0260228 | A1 * | 8/2024 | Chuang | H05K 7/203 |

* cited by examiner

300

340

345

B

Z
Y
X

352

362

352

362

352

340

300

362

300

508

392

510

512

340

506

502

504

B

Z X Y

IMMERSION COOLING SYSTEM FOR INTEGRATED CIRCUIT

PRIORITY DATA

This application claims priority to U.S. Provisional Patent Application No. 63/413,715 filed Oct. 6, 2022, and U.S. Provisional Patent Application No. 63/394,802 filed on Aug. 3, 2022, the entire disclosures of which are hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

In advanced IC device packages, IC devices are vertically stacked and compactly packaged to maximize functional density. The three-dimensional packaging presents a challenge on cooling as regular heat sinks are usually insufficient to effectively dissipate the heat generated in the device packages, while excessive heat may bog down performance of the IC devices. A more powerful cooling scheme, such as immersion cooling, is needed to cool advanced IC device packages down. While existing immersion cooling systems are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
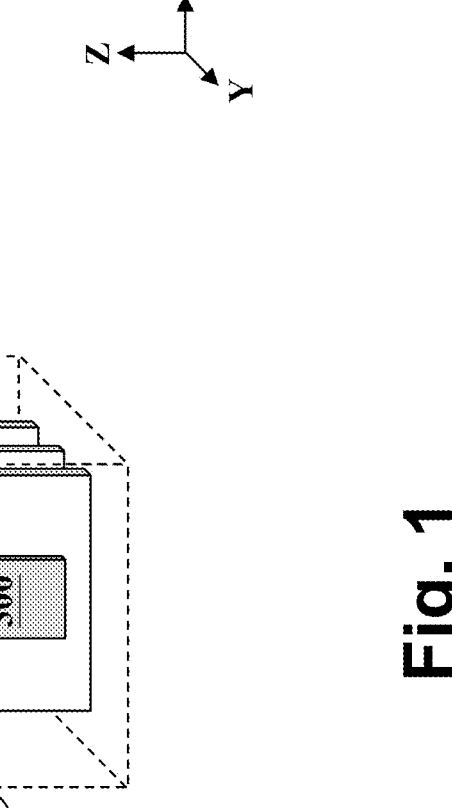
FIGS. 1-6 and 8-12 are schematic perspective views of various immersion cooling systems, according to various aspects of the present disclosure.
Figure 1:
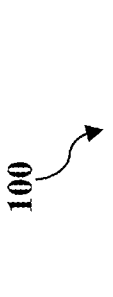

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Significant progress has been made in recent year when it comes to scaling down of semiconductor devices and packaging. For example, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. Packaging of IC devices has also progressed from a matter of convenience to structures to optimize performance, power, form factor (area and volume), thermal dissipation, and cost. For example, integrated fan-out (InFO) packaging structure, chip-on-wafer-on-substrate (CoWoS) structures, system-on-integrated circuit (SoIC) structures, or high-bandwidth memory (HBM) structures all include some level of vertical stacking and integration. The small device dimensions and vertical stacking in device packages present challenges in cooling. The industry often see situations where existing heat sink cooling technology is insufficient to provide satisfactory cooling.

The present disclosure provides embodiments of immersion cooling systems that provide different levels of cooling capabilities and risk management. In some embodiments, the immersion cooling system includes a coolant tank containing a coolant and a cooling coil that is refrigerated with a refrigerant. The cooling coil may be disposed over a surface level of the coolant to function as a condenser or submerged in the coolant to provide direct cooling. In some other embodiments, a circulation pump is disposed in the coolant tank to provide forced convection as it pumps coolant towards the hot spots. The circulation pump may be controlled by a management module that monitors a temperature of the coolant or an electrical resistance of the coolant. When the management module determines that the temperature of the coolant is too high, the management module may increase a power output to the circulation pump to cool down the hot spots. To further improve cooling efficiency, a device package to be received in the coolant tank may include an external shield that aids cooling. Different thermal conductive fins may be mounted on the external shields to increase the contact areas with the coolant. In some implementations, the external shield may include a non-adhesion coating to prevent trapped air bubbles from hindering thermal conduction.

Reference is first made to FIG. 1, which illustrates a perspective see-through view of an immersion cooling system 100 according to some embodiments of the present disclosure. The immersion cooling system 100 represented in FIG. 1 includes a coolant tank 102, a coolant 104 contained in the coolant tank 102, and a cooling coil 108 disposed within the coolant tank 102. For ease of illustration, the coolant tank 102 is shown in dotted lines and its sidewalls are made transparent in FIG. 1. In FIG. 1, the cooling coil 108 is disposed above a surface level 106 of the coolant 104. The coolant tank 102 is configured to receive a plurality of printed circuit boards (PCBs) 200. Each of the PCBs 200 may include at least one device package 300 mounted thereon. For ease of illustration, only one device package 300 is shown in FIG. 1 to be mounted on one of the PCBs 200. However, it should be understood that each of the PCBs 200 may include multiple device packages 300. The combination of one PCB 200 and a plurality of device packages 300 mounted thereon may be regarded as a server rack in server applications. In other words, the coolant tank 102 in FIG. 1 may be understood as being configured to receive multiple server racks. A more detailed description of an example device package 300 will be provided below with reference to FIG. 7.

In the embodiments represented in FIG. 1, one end of the cooling coiling 108 is in fluid communication with an inlet of a first compressor 110. An outlet of the first compressor 110 is coupled to an inlet of a condenser 112. An outlet of the condenser 112 is in fluid communication with the other end of the cooling coil 108 via an expansion valve 114. A refrigerant is circulated through the cooling coil 108 to complete a refrigeration cycle. In one implementation, the cooling coil 108 functions as an evaporator of the refrigerant as a vapor of the coolant 104 vaporizes the refrigerant in the cooling coil 108. The first compressor 110 compresses the refrigerant to a high pressure and high temperature. The compressed refrigerant then flows to the condenser 112, which is a heat exchange that draws heat away from the refrigerant by air or liquid cooling. The refrigerant passing through the condenser 112 is condensed to a liquid form to feed to the expansion valve 114. At the expansion valve 114, the liquid refrigerant undergoes an adiabatic expansion to become cold refrigerant. As the cold refrigerant passes through the cooling coil 108, the cooling coil 108 is brought to a temperature substantially lower than a temperature of vapor of the coolant 104. This allows vapor of the coolant 104 to condense around the cooling coil 108 while the refrigerant in the cooling coil 108 is heated and evaporated.

A maximum temperature difference between the lowest temperature of the refrigerant and a highest temperature of the coolant vapor may be determined by compositions and properties of the refrigerant and the coolant 104. In some embodiments, the coolant 104 may include water, a water-ethylene-glycol (WEG) mixture, a fluoroketone, or a hydro-fluoroether. In embodiment, the coolant 104 includes water. The refrigerant may include chlorofluorocarbons (CFCs), hydrochlorofluorocarbons (HCFCs), ammonia ($NH_3$), water, carbon dioxide, a refrigerant-grade propane, or a refrigerant-grade isobutane. Examples of hydrochlorofluorocarbons (HCFCs) and chlorofluorocarbons (CFCs) include R22, R134a, R407c, R410a, R32, or a combination thereof. An example of the refrigerant-grade propane is R290. An example of the refrigerant-grade isobutane is R600a. In one embodiments, the refrigerant includes chlorofluorocarbons (CFCs) or hydrochlorofluorocarbons (HCFCs). When the refrigerant includes chlorofluorocarbons (CFCs) or hydro-chlorofluorocarbons (HCFCs) and the coolant 104 is water, a maximum temperature difference between the lowest temperature of the refrigerant and a highest temperature of the coolant vapor may be more than 118° C. In some implementation, the coolant tank 102 includes a vent valve 118. The vent valve 118 is configured to release coolant vapor to prevent excessive pressure in the coolant tank 102. In some instances, the vent valve 118 is set to open when a pressure in the coolant tank exceeds 1 standard atmosphere (atm) by 0.1 atm.

Reference is still made to FIG. 1. In operation, the device package 300 may include several hot spots (i.e., areas where heat is generated faster than it is dissipated). The coolant 104 in contact with the hot spots on the device package 300 may locally vaporize to become vapor, which may eventually escape into the space above the surface level 106. The coolant vapor may come in contact with the cooling coil 108 and condense as droplets as shown in FIG. 1. The droplets of the coolant 104 may enter the body of the coolant 104. Because the coolant 104 in FIG. 1 switches between two phases during the cooling cycle, the immersion cooling system 100 in FIG. 1 may be referred as a 2-phase cooling system. In some other embodiments, the surface of the cooling coil 108 may fall below a freezing point of the coolant 104 and the condensed coolant 104 may freeze around the cooling coil 108 to form solid (e.g., ice when the coolant 104 is water). In these embodiments, the immersion cooling system 100 in FIG. 1 may be referred to a 3-phase cooling system.

Figure 2:
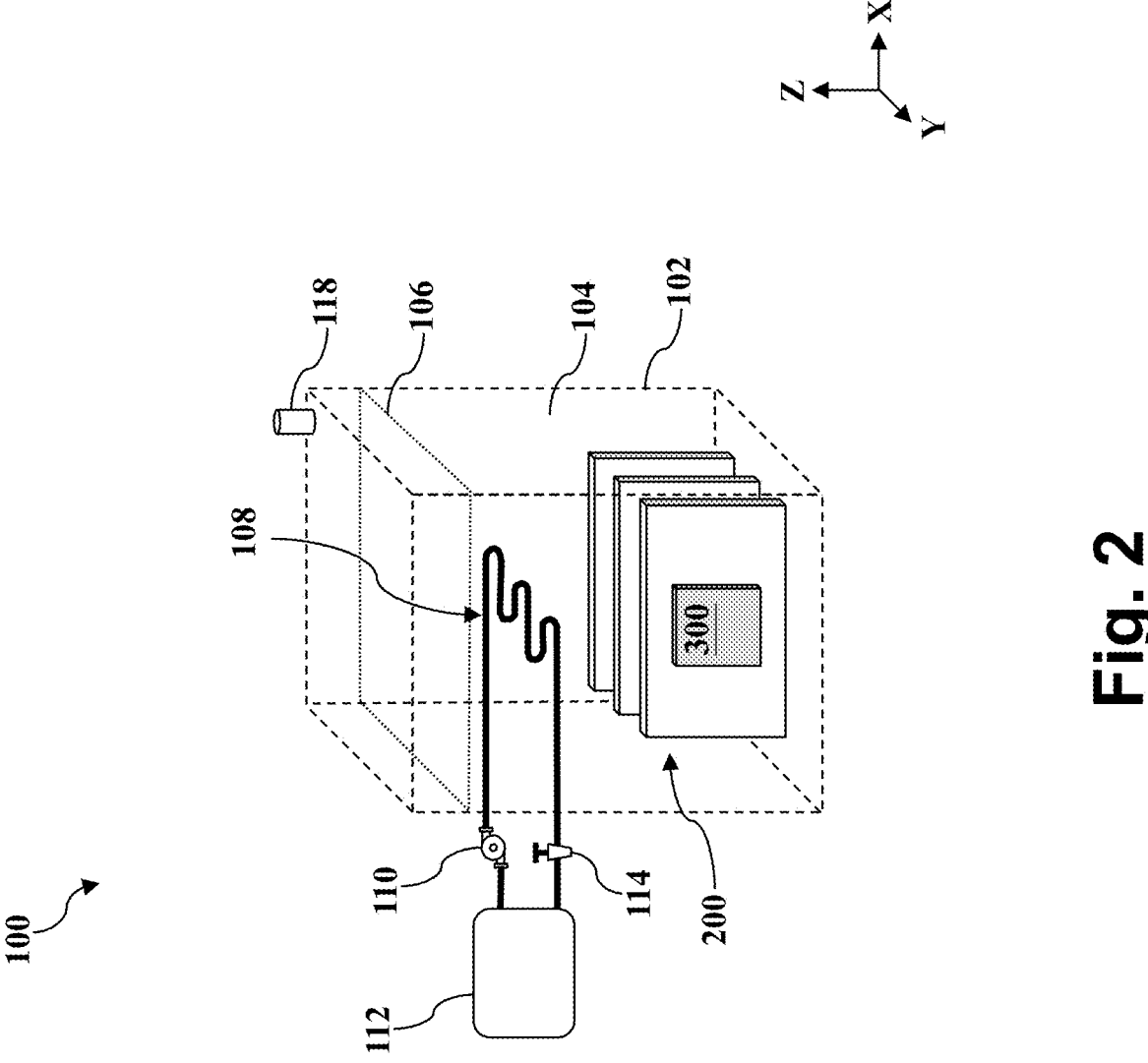

Reference is then made to FIG. 2, which illustrates a perspective see-through view of an immersion cooling system 100 according to some alternative embodiments of the present disclosure. As compared to the immersion cooling system 100 in FIG. 1, the cooling coil 108 is completely submerged in the coolant 104. In other words, an entirety of the cooling coil 108 is disposed below the surface level 106 of the coolant 104. In the embodiments represented in FIG. 2, the cooling coil 108 directly cools down the coolant 104, instead of condensing vapor of the coolant 104. It is noted that while the cooling coil 108 is submerged in the coolant 104 as shown in FIG. 2, there is still space above the surface level 106 of the coolant. Vapor of the coolant 104 may fill this space. In this sense, the immersion cooling system 100 in FIG. 2 may be a 2-phase cooling system. In some instances, a layer of ice may be formed around surfaces of the cooling coil 108 at equilibrium. Because of presence of this layer of ice, the immersion cooling system 100 in FIG. 2 may be referred to as a 3-phase cooling system.

Figure 3:
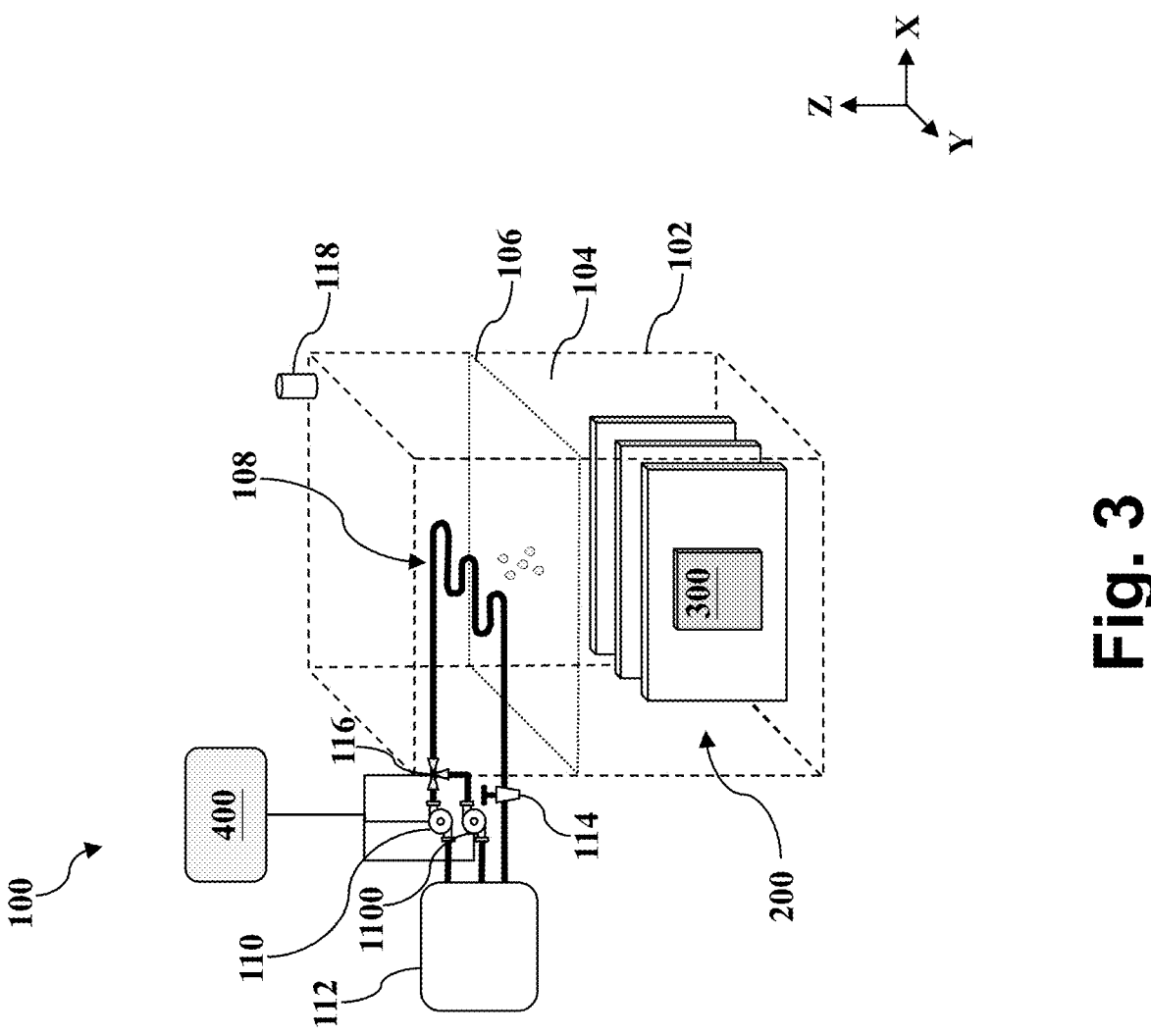

Reference is made to FIG. 3, which illustrates a perspective see-through view of an immersion cooling system 100 according to some alternative embodiments of the present disclosure. The immersion cooling system 100 in FIG. 3 further includes a second compressor 1100 in addition to the first compressor 110. Both the first compressor 110 and the second compressor 1100 are in fluid communication with the outlet of the cooling coil 108 via a three-way valve 116. The three-way valve 116 is configured to switch between at least two positions. At a first position, the three-way valve 116 allows fluid communication between the first compressor 110 and the outlet of the cooling coil 108 but blocks the fluid communication between the second compressor 1100 and the outlet of the cooling coil 108. At a second position, the three-way valve 116 allows fluid communication between the second compressor 1100 and the outlet of the cooling coil 108 but blocks the fluid communication between the first compressor 110 and the outlet of the cooling coil 108. In the embodiments represented in FIG. 3, the second compressor 1100 serves as a backup compressor. In some implementations, the first compressor 110, the second compressor 1100, and the three-way valve 116 are all connected to and controlled by a management module 400. When the management module 400 detects an abnormal surge of current or electrical resistance at the first compressor 110, the management module 400 may cause the three-way valve 116 to move to the second position and activate the second compressor 1100. The implementation of the three-way valve 116 and the second compressor 1100 ensures that the immersion cooling system 100 continues to cool the device packages 300 without any stoppage. Once the management module 400 turns on the second compressor 1100, the second compressor 1100 will continue in operation until and unless that it has been confirmed that the abnormal condition of the first compressor 110 is no longer present.

Figure 4:
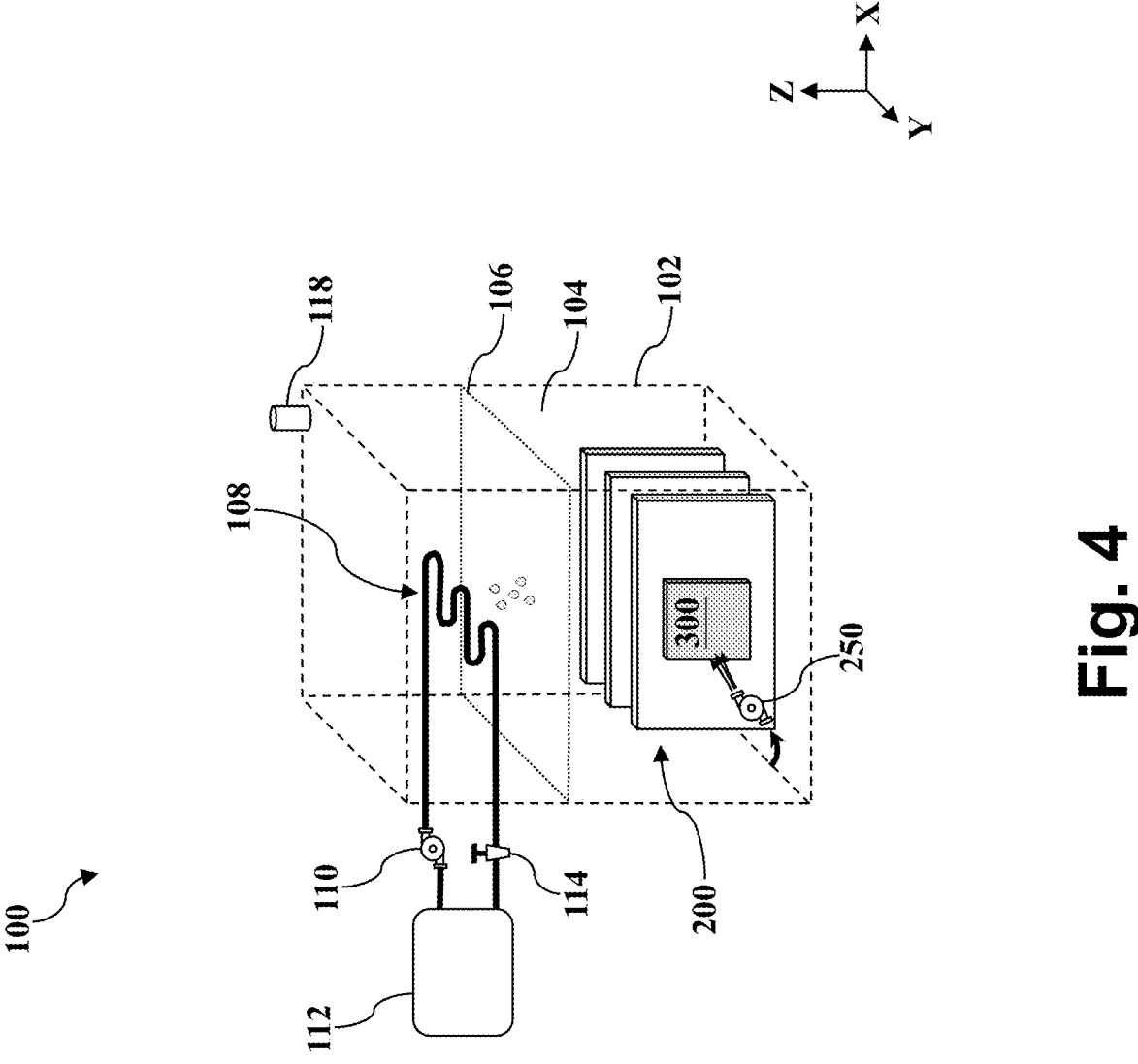

Reference is now made to FIG. 4, which illustrates a perspective see-through view of an immersion cooling system 100 according to some alternative embodiments of the present disclosure. The immersion cooling system 100 in FIG. 4 further includes a circulation pump 250. The circulation pump 250 includes an intake to suck in the coolant 104 and blows the coolant 104 through an outlet or a nozzle. As shown in FIG. 4, the circulation pump 250 is configured to thrust or propel coolant 104 toward the device package 300 where the hot spots reside. It is noted that while only one circulation pump 250 is shown in FIG. 4, the immersion system 100 in FIG. 4 may include multiple circulation pumps. In one embodiment, the immersion cooling system 100 includes at least one circulation pump 250 for each of the PCBs 200. The circulation pumps 250 provide forced convection to help cool down the device package 300 more efficiently. The circulation pump 250 brings relatively cooler coolant 104 farther away from the device package 300 into direct contact with the device package 200 that may include hot spots. In some embodiments illustrated in FIG. 4, the circulation pump 250 is set to be ON and is not actively controlled by any management module.

Figure 5:
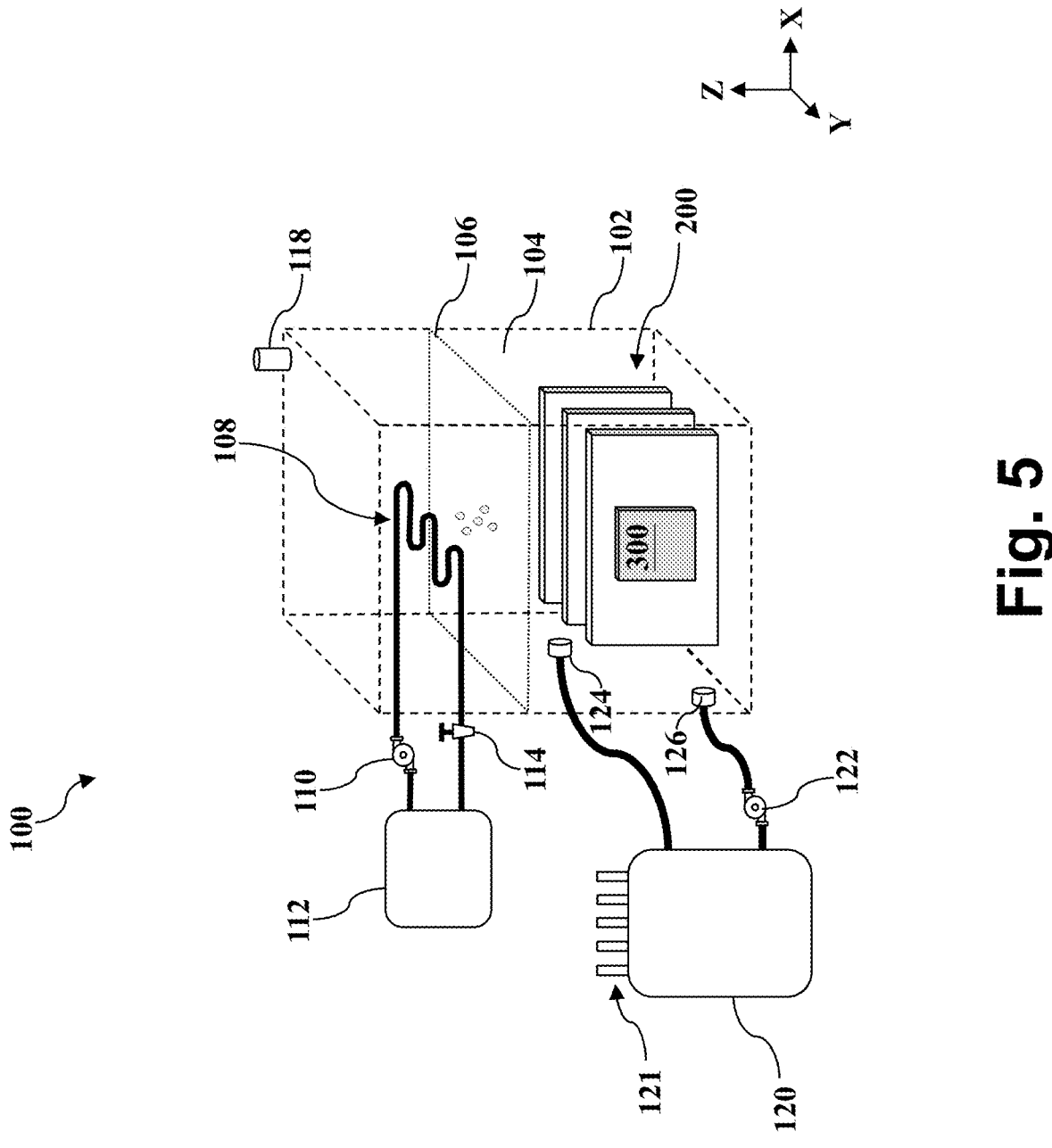

Reference is then made to FIG. 5, which illustrates a perspective see-through view of an immersion cooling system 100 according to some alternative embodiments of the present disclosure. In the immersion cooling system 100 represented in FIG. 5, the coolant 104 contained in the coolant tank 102 is also circulated. As shown in FIG. 5, the coolant 104 is allowed to drain through a tank outlet 124 into a reservoir 120 and is pumped back by a pump 122 into the coolant tank 102 via a tank inlet 126. In some implementations, the tank outlet 124 is disposed at a location higher than that of the tank inlet 126 such that the coolant 104 draining through the tank outlet 124 has a higher temperature and a lower density than the coolant 104 flowing through the tank inlet 126. The reservoir 120 may be a tank with or without a heat exchanger. In at least some implementations, the cooling of the coolant 104 in the coolant tank 102 is provided primarily by the cooling coil 108 and the reservoir 120 functions as a temporary holding chamber of the coolant 104. In some alternative implementations, the cooling of the coolant 104 in the coolant tank 102 is provided by both the cooling coil 108 and a heat exchanger 121 mechanically coupled to the reservoir 120. In some embodiments, the heat exchanger 121 may include a plurality of metal fins that help dissipate heat from the reservoir 120. The metal fins may include metal with high thermal conductivity, such as copper (Cu) or aluminum (Al).

Figure 6:
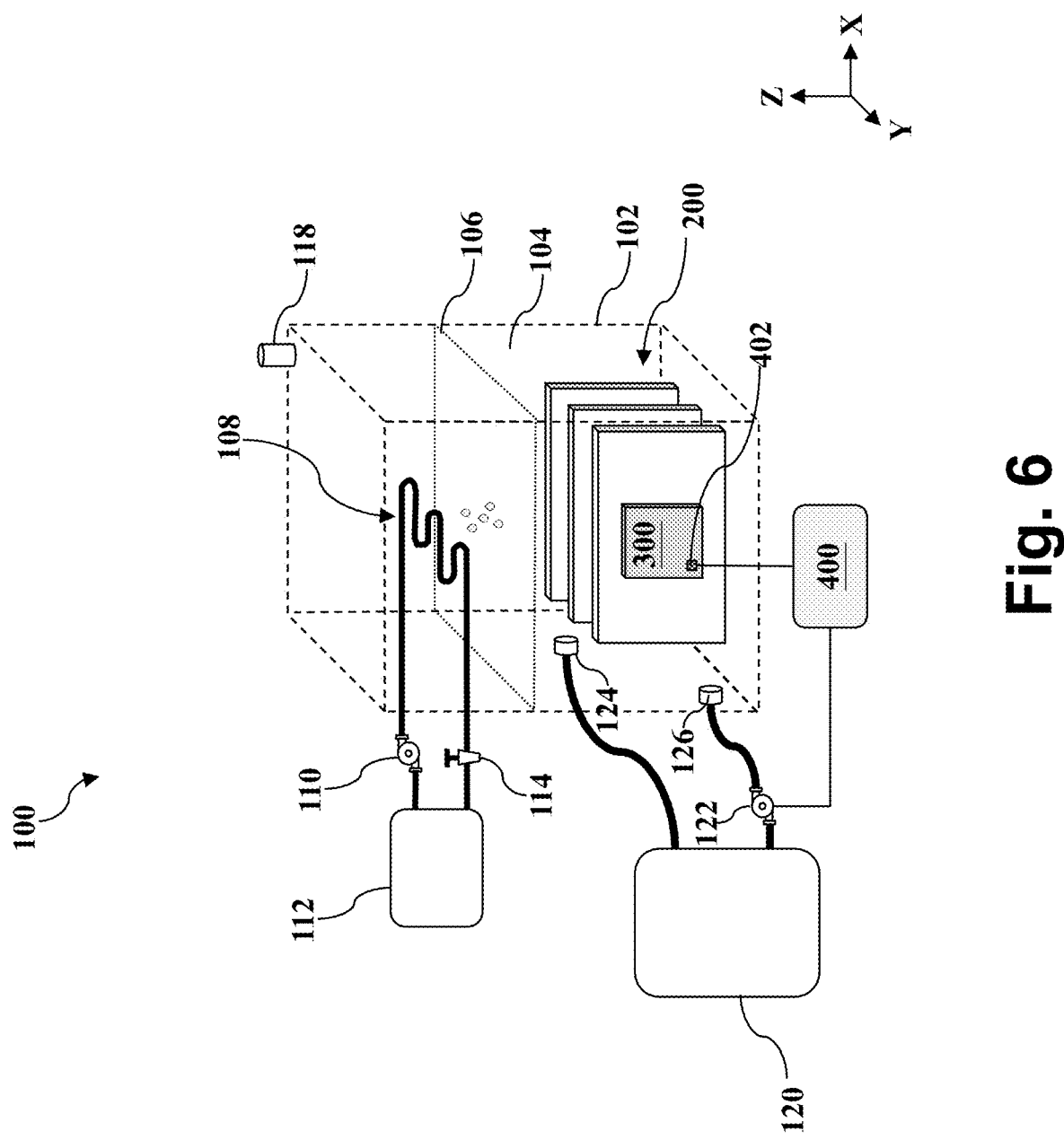

Reference is made to FIG. 6, which illustrates a perspective see-through view of an immersion cooling system 100 according to some alternative embodiments of the present disclosure. Compared to the immersion cooling system 100 shown in FIG. 5, the immersion cooling system 100 in FIG. 6 further includes a first temperature sensor 402 and the pump 122 is controlled by a management module 400 that receives input from the first temperature sensor 402. In the embodiments depicted in FIG. 6, the first temperature sensor 402 is disposed adjacent the device package 300 that includes several hot spots. Both the first temperature sensor 402 and the pump 122 are electrically connected to the management module 400. The first temperature sensor 402 may be a thermocouple, a resistance temperature detector, a thermistor, a diode, or a transistor. During operation, the management module 400 monitors temperature at the device package 300 using the first temperature sensor 402. When the temperature detected by the first temperature sensor 402 exceeds a predetermined temperature, such as a temperature between about 105° C. and about 120° C., the management module 400 may activate the pump 122 or increase the output of the pump 122. The activation or an increase of output of the pump 122 may start or boost the circulation of the coolant 104 in the coolant tank 102 to bring down the temperature of the coolant 104.

Figure 7:
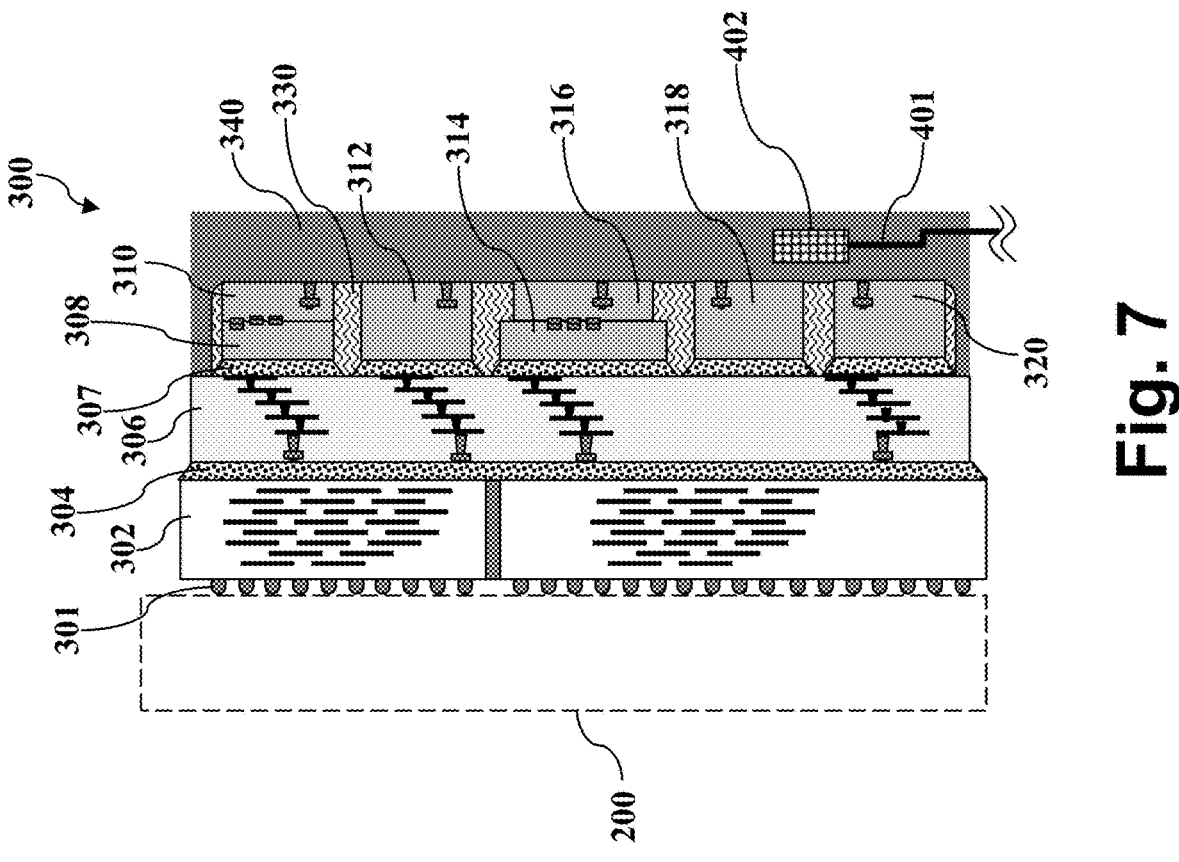
FIGS. 7 and 13-23 are fragmentary side views of various device packages, according to various aspects of the present disclosure.

FIG. 7 is a cross-sectional view of a device package 300 mounted on a PCB 200 according to some examples of the present disclosure. As shown in FIG. 7, a primary device mounting surface of the PCB 200 extends parallel to a sidewall of the coolant tank 102. As the device package 300 is mounted on the PCB 200, layers in the device package 300 are stacked along the Y direction, perpendicular to the vertical direction (i.e., the Z direction). The example device package 300 includes a package substrate 302, an interposer 306 disposed over the package substrate 302, and a plurality of chips mounted on the interposer 306. In some embodiments, the package substrate 302 includes a core sandwiched between two build-up layers. The core may include polyimide or glass-reinforced epoxy. Each of the two build-up layers may include vias and metal lines embedded in dielectric material layers. A plurality of through-vias may extend through the core to electrically couple features in the two build-up layers. The vias and metal lines may include copper. The interposer 306 may be a silicon interposer that includes through-substrate-vias in a silicon substrate. In some instances, one or more redistribution layers (RDLs) may be formed over and/or below the silicon interposer. Each of the RDLs may include a plurality of metal layers embedded in multiple dielectric layers. The plurality of metal layers in the RDLs may include metal, such as copper. Chips shown in FIG. 7 may include a photonic IC (P-die) 308, an electronic IC (E-die) 310, a first memory IC (e.g., a high bandwidth memory (HBM)) 312, a first IC chip 314, a second IC chip 316, a third IC chip 318, and a second memory IC 320. Gaps among sidewalls of these chips may be filled with an encapsulant 330, which may include epoxy or polyimide. It should be understood that the device package 300 shown in FIG. 7 is provided for illustration purpose only and the device package 300 may include more or less chips to perform a variety of functions.

Some of the chips in FIG. 7 may be directly bonded to one another. For example, the E-die 310 may be flipped over and bonded directly to the P-die 308 and the second IC chip 316 may be flipped over and bonded directly to the first IC chip 314. Each of the first memory IC 312 and the second memory IC 320 may include more than one dynamic random access memory die that are vertically electrically coupled together by way of through vias. In some implementations, the P-die 308, the first memory IC 312, the first IC chip 314, the third IC chip 318, and the second memory IC 320 may be mounted on the interposer 306 by way of micro-bumps buried in a first underfill 307. The interposer 306 may be bonded to the package substrate 302 by way of controlled collapse chip connection (C4) bumps buried in a second underfill 304. The package substrate 302 is bonded to the PCB 200 by way of package bumps 301.

To protect the chips from ingress of water and stress, the device package 300 may further include a molding layer 340 as an external shield. In some embodiments, the molding layer 340 may have a polymer matrix including epoxy, polyimide, silicone resin, polyurethane, or polyacrylate. To improve the thermal conductivity of the molding layer 340, filler particles may be embedded in the polymer matrix of the molding layer 340. The filler particles may be electrically insulative or electrically conductive. Example electrically insulative filler particles may include diamond particles (an electrically insulative form of carbon), aluminum oxide, boron nitride, zinc oxide, silicon, germanium, or aluminum nitride. Example electrically conductive filler particles may include graphite (an electrically conductive form of carbon), titanium, tantalum, aluminum, aluminum copper, aluminum silicon copper, copper, manganese, tungsten, zinc, or nickel. In some embodiments, the first temperature sensor 402 illustrated in FIG. 6 may be embedded in the molding layer 340 as shown in FIG. 7. The first temperature sensor 402 is electrically coupled to the management module 400 via a lead 401.

Figure 8:
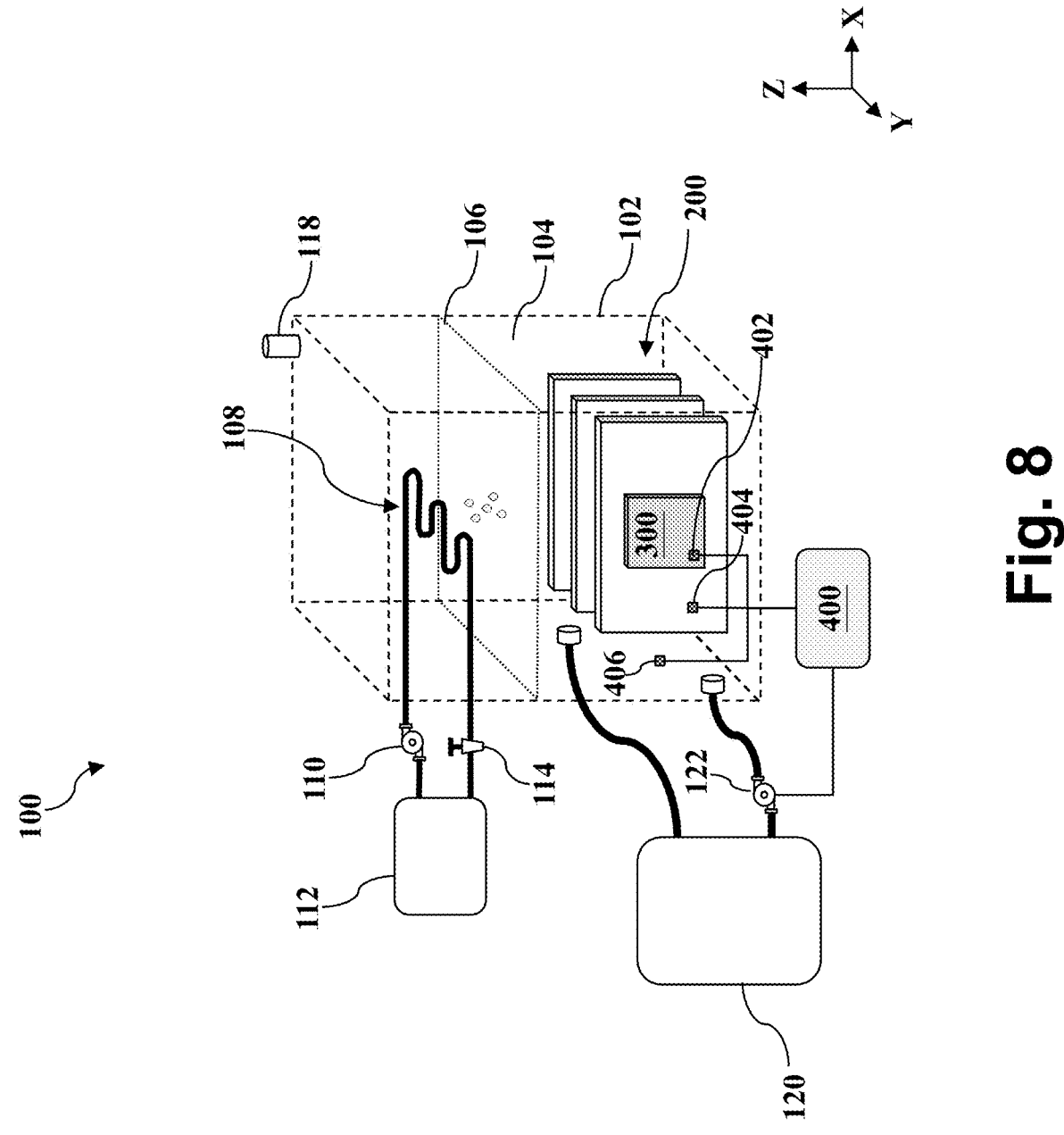

Reference is now made to FIG. 8, which illustrates a perspective see-through view of an immersion cooling system 100 according to some alternative embodiments of the present disclosure. Compared to the embodiment shown in FIG. 6, the immersion cooling system 100 in FIG. 8 further includes a second temperature sensor 404 disposed on the PCB 200 and a third temperature sensor 406 disposed on an interior surface of the coolant tank 102. The first temperature sensor 402, the second temperature sensor 404, and the third temperature sensor 406 may have similar constructions and are all electrically coupled to the management module 400. The management module 400 receives temperature data from the first temperature sensor 402, the second temperature sensor 404, and the third temperature sensor 406 to modulate a power output to the pump 122. For example, when the temperature detected by the first temperature sensor 402 is greater than the temperature detected by the second temperature sensor 404 by more than a pre-determined value, such as between about 10° C. and about 20° C., the thermal stress due to differences of coefficient of thermal expansion (CTE) of the polymeric material in the PCB 200 and the semiconductor material in the device package 300 may jeopardize the integrity of the solder bumps. When that condition arises, the management module 400 may increase the power output to the pump 122 to increase the circulation of the coolant 104 within the coolant tank 102 to reduce the temperature difference. For another example, when the temperature detected by the first temperature sensor 402 is greater than the temperature detected by the third temperature sensor 406 by more than a pre-determined value, such as between about 20° C. and about 30° C., the thermal distribution within the coolant 104 is very non-uniform. When that condition is present, the management module 400 may increase the output of the pump 122 to increase the coolant circulation to achieve a more uniform thermal distribution.

Figure 9:
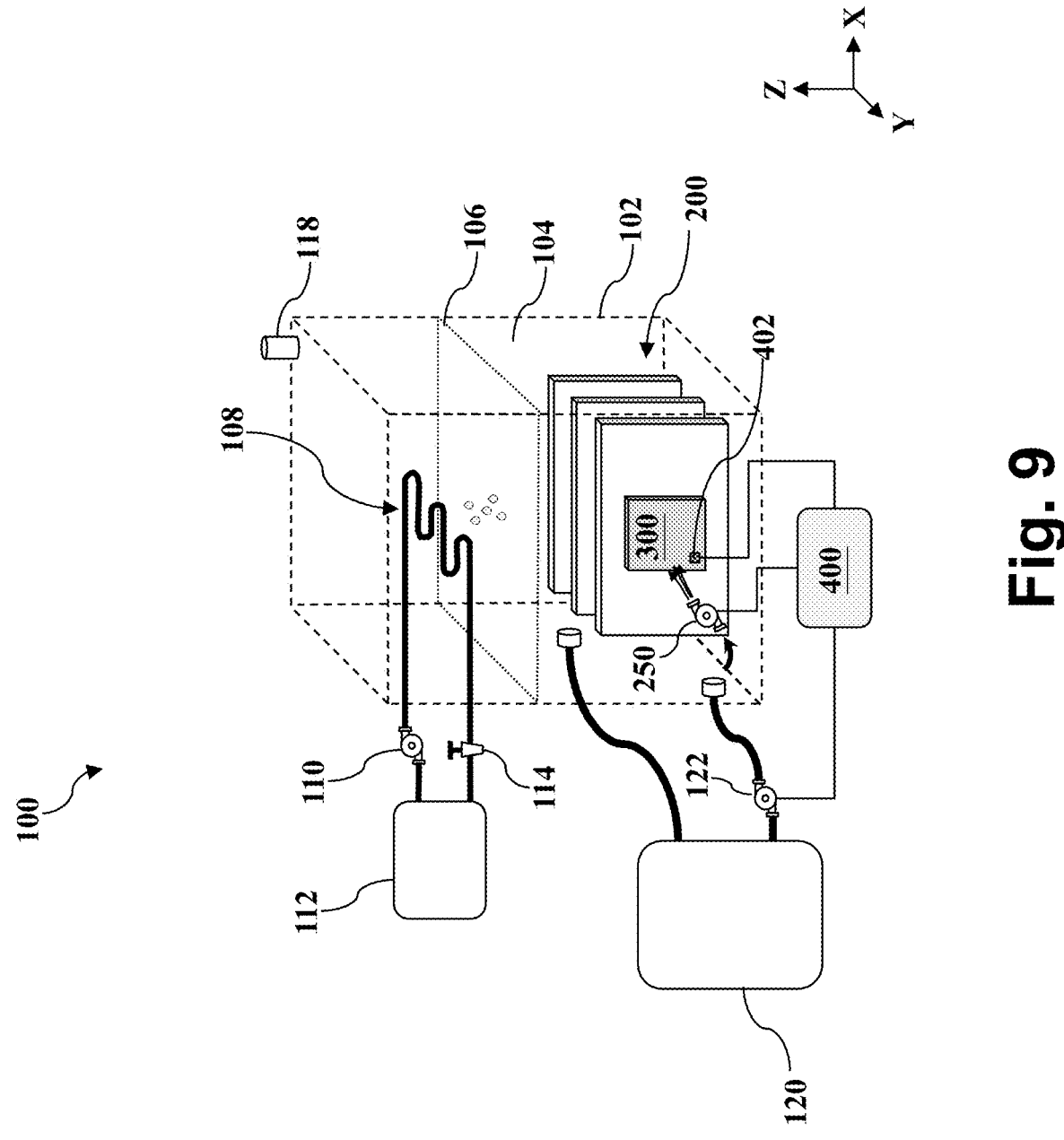

Reference is then made to FIG. 9, which illustrates a perspective see-through view of an immersion cooling system 100 according to some alternative embodiments of the present disclosure. Compared to the embodiment shown in FIG. 6, the immersion cooling system 100 in FIG. 9 further includes a circulation pump 250 controlled by the management module 400. During operation, the management module 400 monitors temperature at the device package 300 using the first temperature sensor 402. When the temperature detected by the first temperature sensor 402 exceeds a predetermined temperature, such as a temperature between about 105° C. and about 120° C., the management module 400 may activate the pump 122 and the circulation pump 250. The activation of the pump 122 and the circulation pump 250 may boost the circulation of the coolant 104 in the coolant tank 102 to bring down the temperature of the coolant 104.

Figure 10:
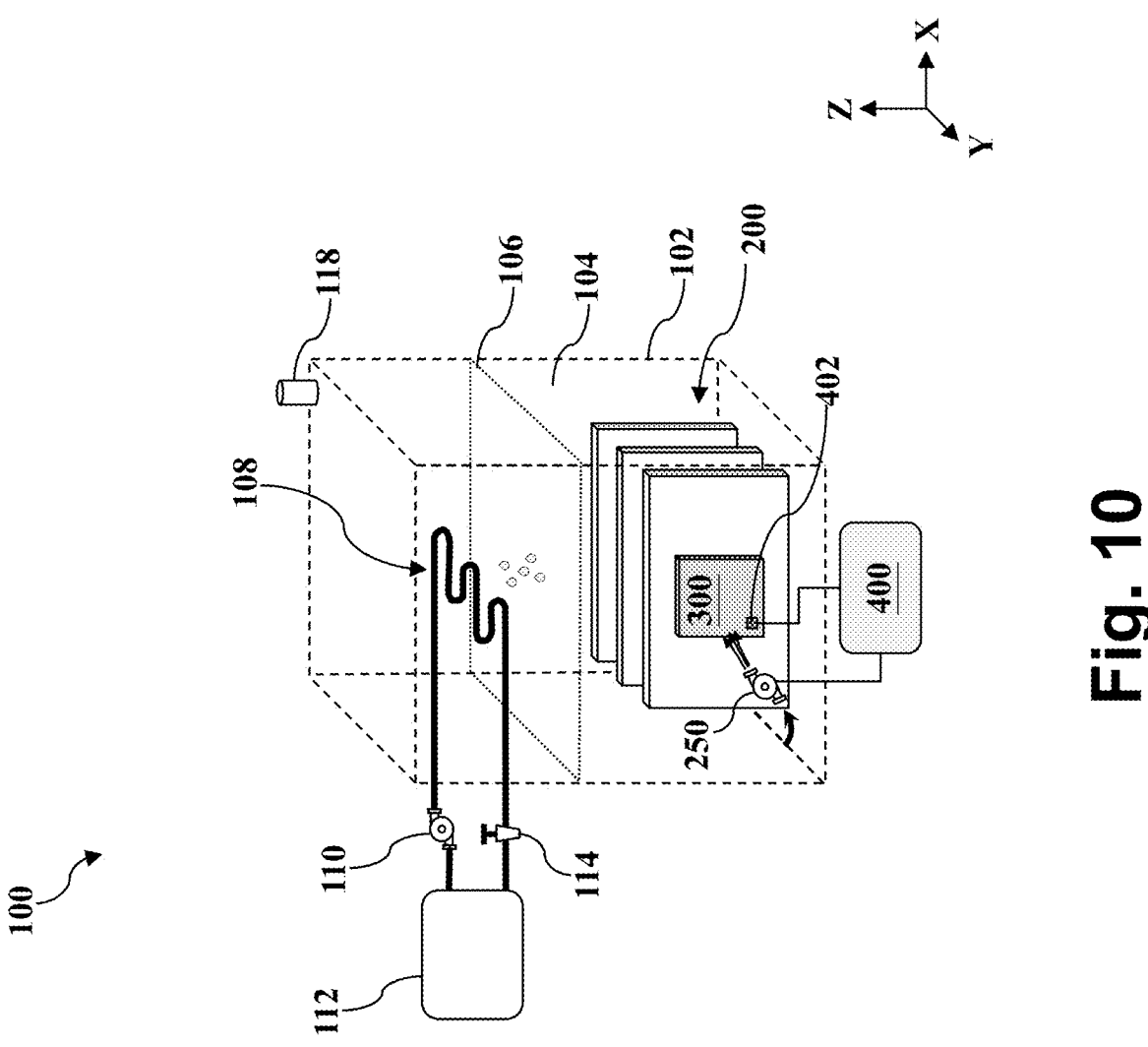

Reference is made to FIG. 10, which illustrates a perspective see-through view of an immersion cooling system 100 according to some alternative embodiments of the present disclosure. Compared to the embodiment shown in FIG. 6, the immersion cooling system 100 in FIG. 10 includes a circulation pumps 250 controlled by the management module 400 but the coolant 104 is not circulated to the reservoir 120 by the pump 122. During operation, the management module 400 monitors temperature at the device package 300 using the first temperature sensor 402. When the temperature detected by the first temperature sensor 402 exceeds a predetermined temperature, such as a temperature between about 105° C. and about 120° C., the management module 400 may activate or increase output of the circulation pump 250. The activation or power increase of the circulation pump 250 may boost the circulation of the coolant 104 in the coolant tank 102 to bring down the temperature of the coolant 104.

Figure 11:
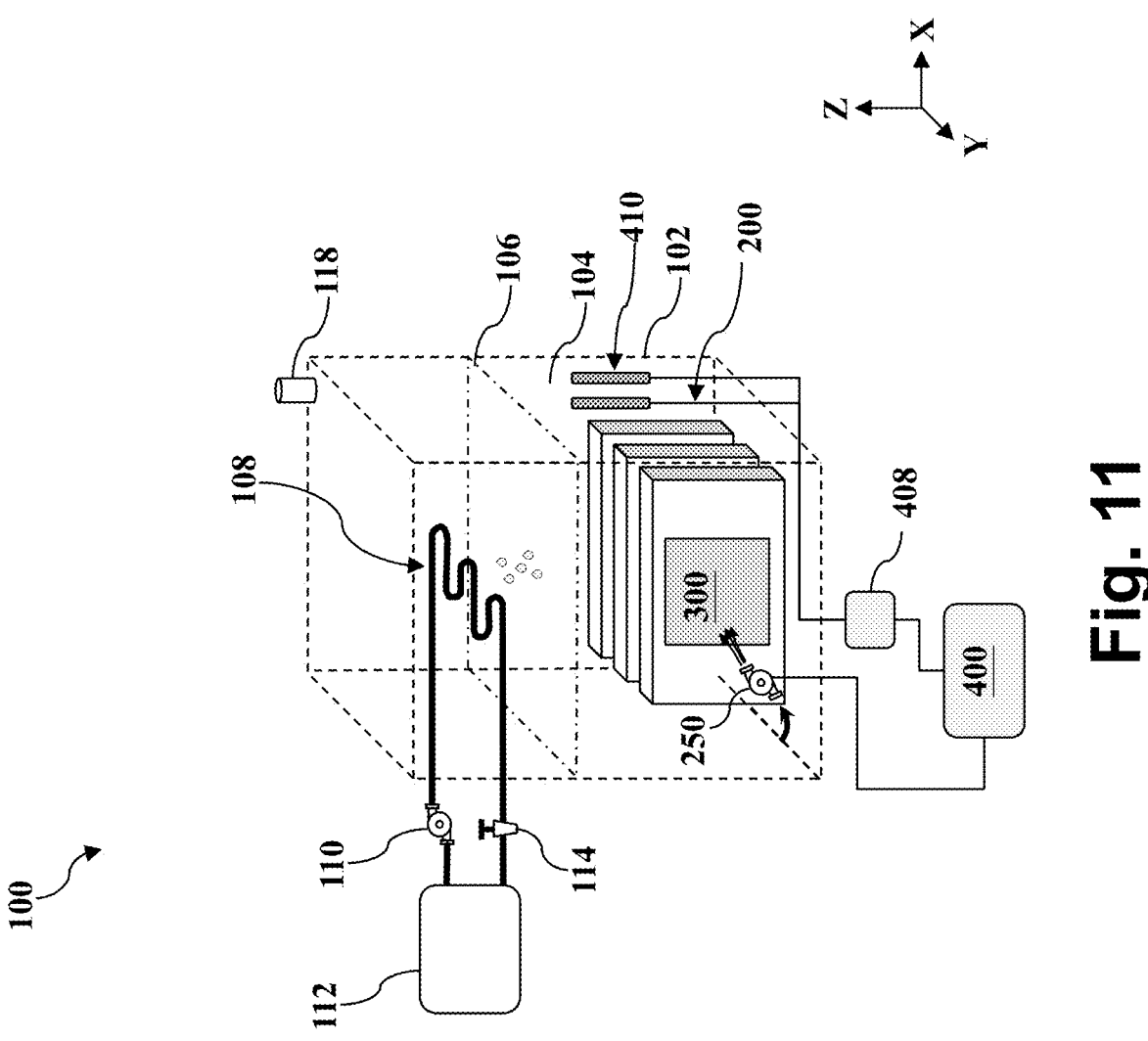

Reference is made to FIG. 11, which illustrates a perspective see-through view of an immersion cooling system 100 according to some alternative embodiments of the present disclosure. Compared to the embodiment shown in FIG. 10, the immersion cooling system 100 in FIG. 11 includes a resistance probe 410 in place of the first temperature sensor 402. In some embodiments represented in FIG. 11, the resistance probe 410 may include two electrodes that are spaced apart by a set distance. The resistance probe 410 is electrically coupled to a resistance meter 408. The resistance meter 408 measures resistance of the coolant 104 between the two electrodes of the resistance probe 410 and determines a temperature of the coolant 104 based on a resistance-temperature curve of the coolant 104. For example, when the coolant 104 is water, the resistance measured by the resistance probe 410 decreases with the increase of temperature. During operation, the management module 400 monitors temperature data provided by the resistance meter 408. When the temperature exceeds a predetermined temperature, such as a temperature between about 105° C. and about 120° C., the management module 400 may activate or increase output of the circulation pump 250. The activation or power increase of the circulation pump 250 may boost the circulation of the coolant 104 in the coolant tank 102 to bring down the temperature of the coolant 104. While not explicitly shown in FIG. 11, the resistance meter 408 may be integrated with the management module 400.

Figure 12:
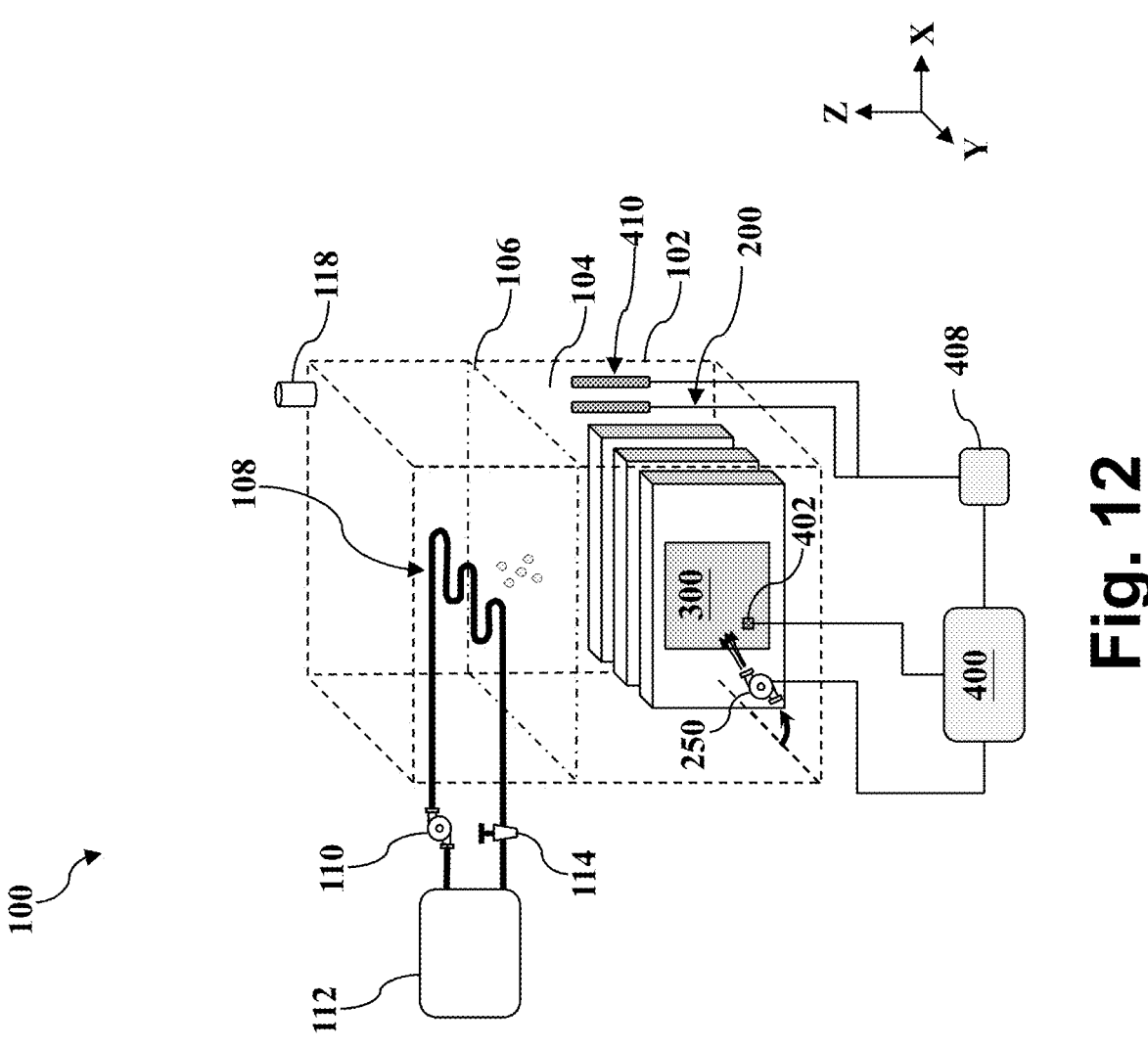

Reference is then made to FIG. 12, which illustrates a perspective see-through view of an immersion cooling system 100 according to some alternative embodiments of the present disclosure. Compared to the embodiment shown in FIG. 11, the immersion cooling system 100 in FIG. 12 adopts a redundancy design by including both the first temperature sensor 402 and the resistance probe 410. The redundancy lies in the fact that both the first temperature sensor 402 and the resistance probe 410 measure temperature information. During operation, the management module 400 monitors temperature data provided by the resistance meter 408 and the first temperature sensor 402. When the temperature detected by any of the resistance meter 408 and the first temperature sensor 402 exceeds a predetermined temperature, such as a temperature between about 105° C. and about 120° C., the management module 400 may activate or increase output of the circulation pump 250. The activation or power increase of the circulation pump 250 may boost the circulation of the coolant 104 in the coolant tank 102 to bring down the temperature of the coolant 104. While not explicitly shown in FIG. 12, the resistance meter 408 may be integrated with the management module 400.

The present disclosure also includes various embodiments to be implemented to or around the device package 300. These embodiments are illustrated in FIGS. 13-23.

Figure 13:
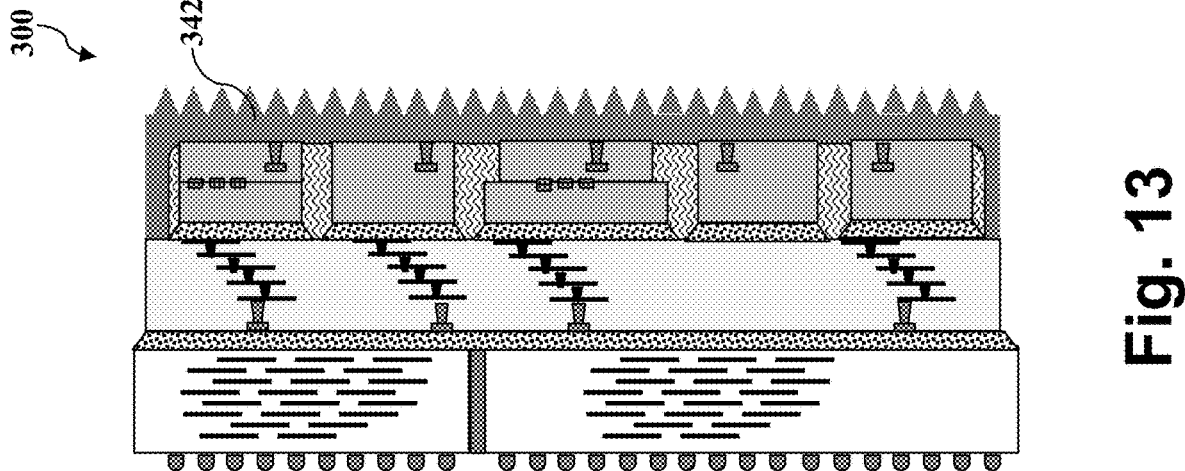

FIG. 13 illustrates a rugged molding layer 342 to improve heat dissipation. The non-smooth and rugged surface of the rugged molding layer 342 on the device package 300 increases the contact surface area with the coolant 104, thereby increasing the heat dissipation into the coolant 104.

Figure 14:
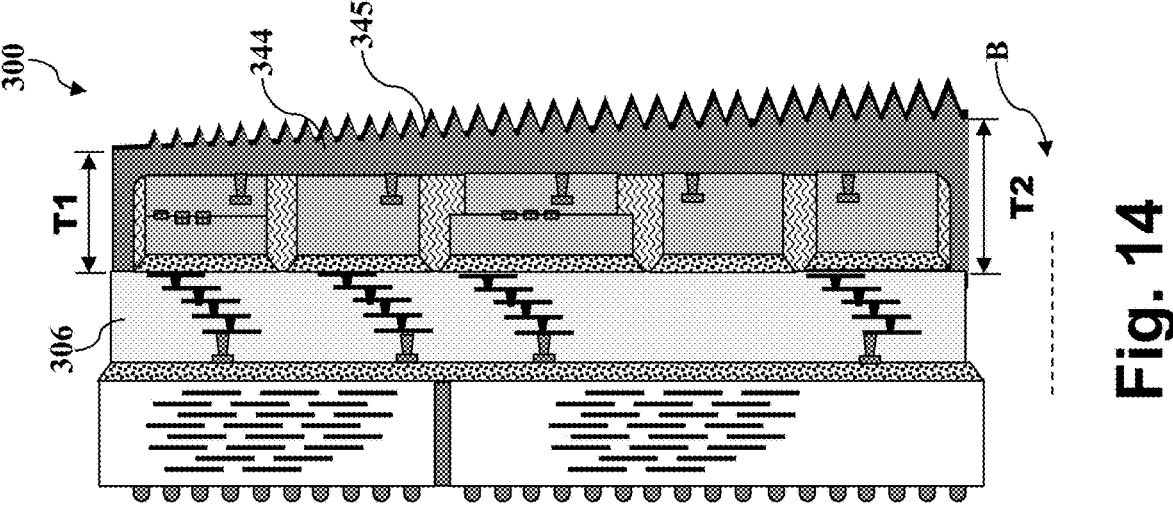
Figure 14:
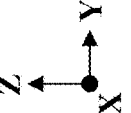

FIG. 14 illustrates a sloped molding layer 344 to improve heat dissipation. In some embodiments represented in FIG. 14, a thickness of the sloped molding layer 344 measured from the top surface of the interposer 306 decreases from a lower position in the coolant tank 102 to a higher position in the coolant tank 102. For ease of illustration, a bottom surface B of the coolant tank 102 is schematically illustrated in FIG. 14. The sloped molding layer 344 has a first thickness T1 away from the bottom surface B and a second thickness T2 adjacent the bottom surface B. The second thickness T2 is greater than the first thickness T1. In some instances, the first thickness T1 is between about 300 μm and about 400 μm and the second thickness is between about 350 μm and about 500 μm. In other words, the sloped molding layer 344 has an outer surface that slopes upwards away from the bottom surface B. This sloped profile may facilitate upward movement of vapor bubbles generated around hot spots on the device package 300. Vapor bubbles along surfaces of the molding layer 340 may form a heat insulation layer or thermal barrier layer that prevents satisfactory heat exchange between the molding layer 340 and the coolant 104. By facilitating upward movement of vapor bubbles, the sloped molding layer 344 may disrupt the vapor bubble thermal barrier and improve the heat exchange process. In the depicted embodiments, an external surface of the sloped molding layer 344 is coated with a non-adhesion coating 345. The non-adhesion coating 345 may include polytetrafluoroethylene (PTFE) and prevent adhesion of vapor bubbles on surfaces of the sloped molding layer 344. In the depicted embodiments, the sloped molding layer 344 has a rugged surface, similar to the rugged molding layer 342 shown in FIG. 13.

Figure 15:
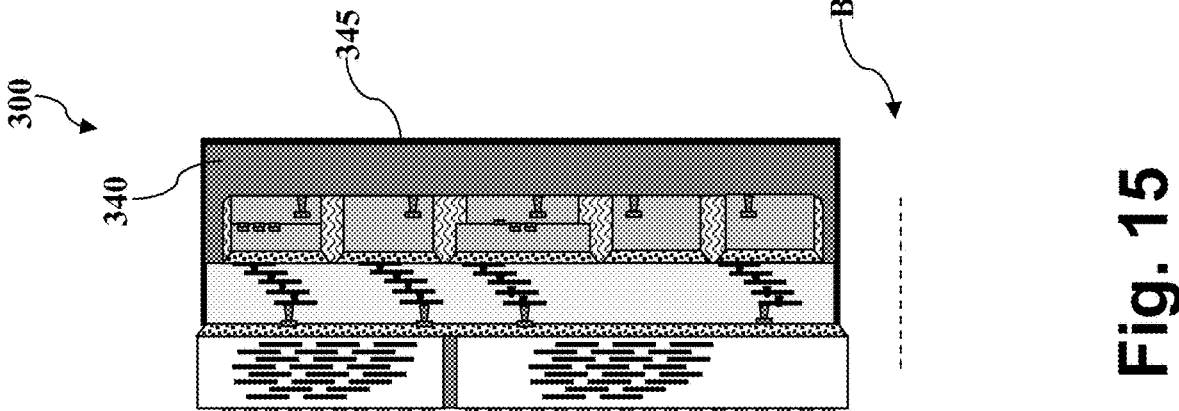
Figure 15:
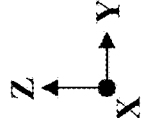

FIG. 15 illustrates a non-adhesion coating 345 to improve heat conduction. In some embodiments, the molding layer 340 has a substantially smooth surface and is coated with the non-adhesion coating 345 to facilitate upward movement of the vapor bubbles. As described above with respect to the embodiments shown in FIG. 14, the non-adhesion coating 345 may include PTFE.

Figure 16:
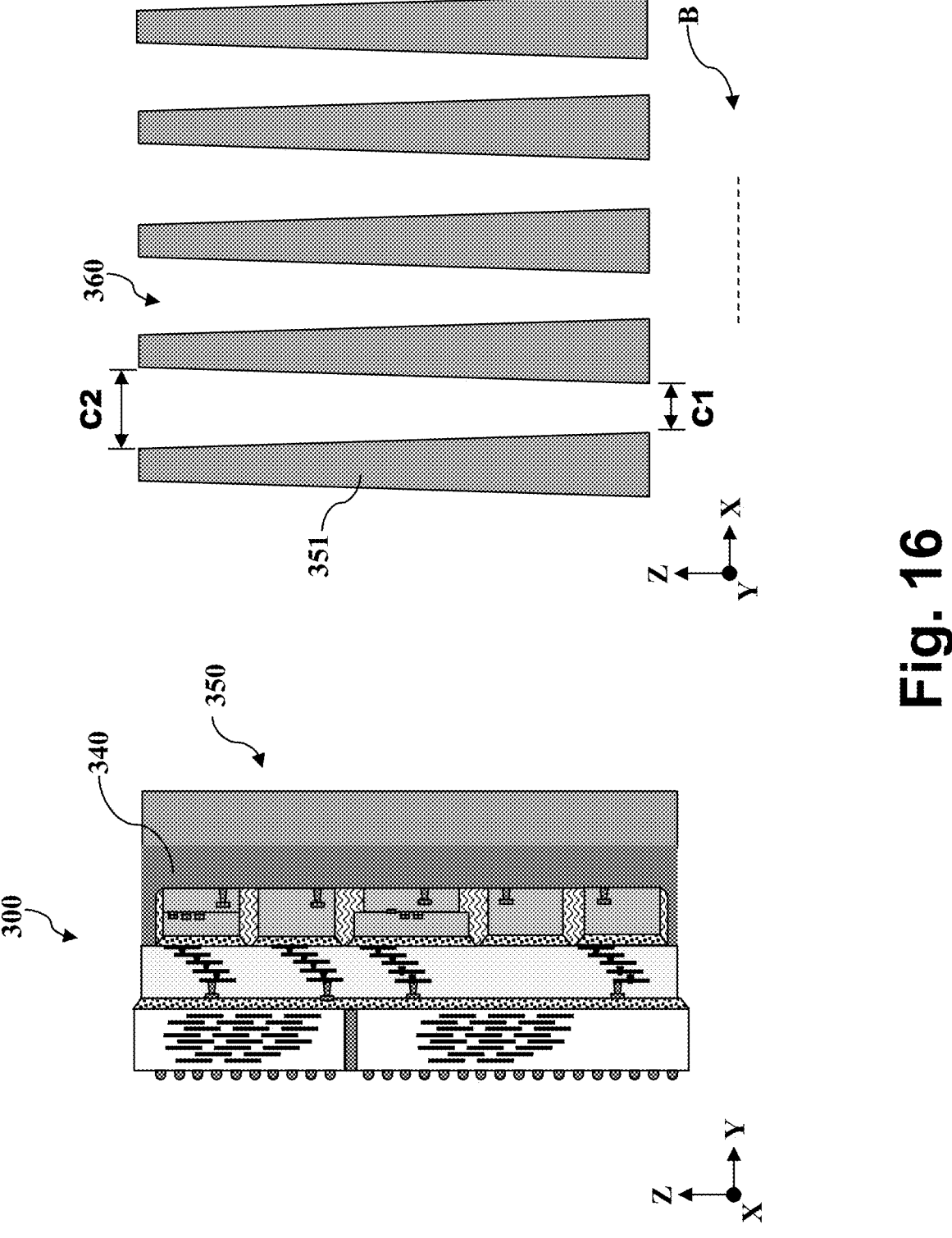

FIG. 16 illustrates a first heat sink 350 mounted on the molding layer 340. In some embodiments, the first heat sink 350 may include a highly thermally conductive materials such as copper, aluminum, aluminum nitride, or silicon carbide. As shown in FIG. 16, when viewed along the Y direction perpendicular to a primary surface of the device package 300, the first heat sink 350 includes a plurality of fins 351. Each of the plurality of fins 351 has a sloped profile such that they define first sloped channels 360. Each of the first sloped channels 360 has a first channel width C1 along the X direction adjacent to the bottom surface B of the coolant tank 102 and a second channel width C2 along the X direction away from the bottom surface B. In some implementations, the second channel width C2 is greater than the first channel width C1. The sloped profile of the first sloped channels 360 facilitates upward movement of the vapor bubbles, thereby improving heat exchange efficiency.

Figure 17:
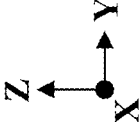

FIG. 17 illustrates a second heat sink 352 mounted on the molding layer 340. In some embodiments, the second heat sink 352 includes a plurality of disk-like island features 362. The second heat sink 352 may include a highly thermally conductive materials such as copper, aluminum, aluminum nitride, or silicon carbide.

Figure 18:
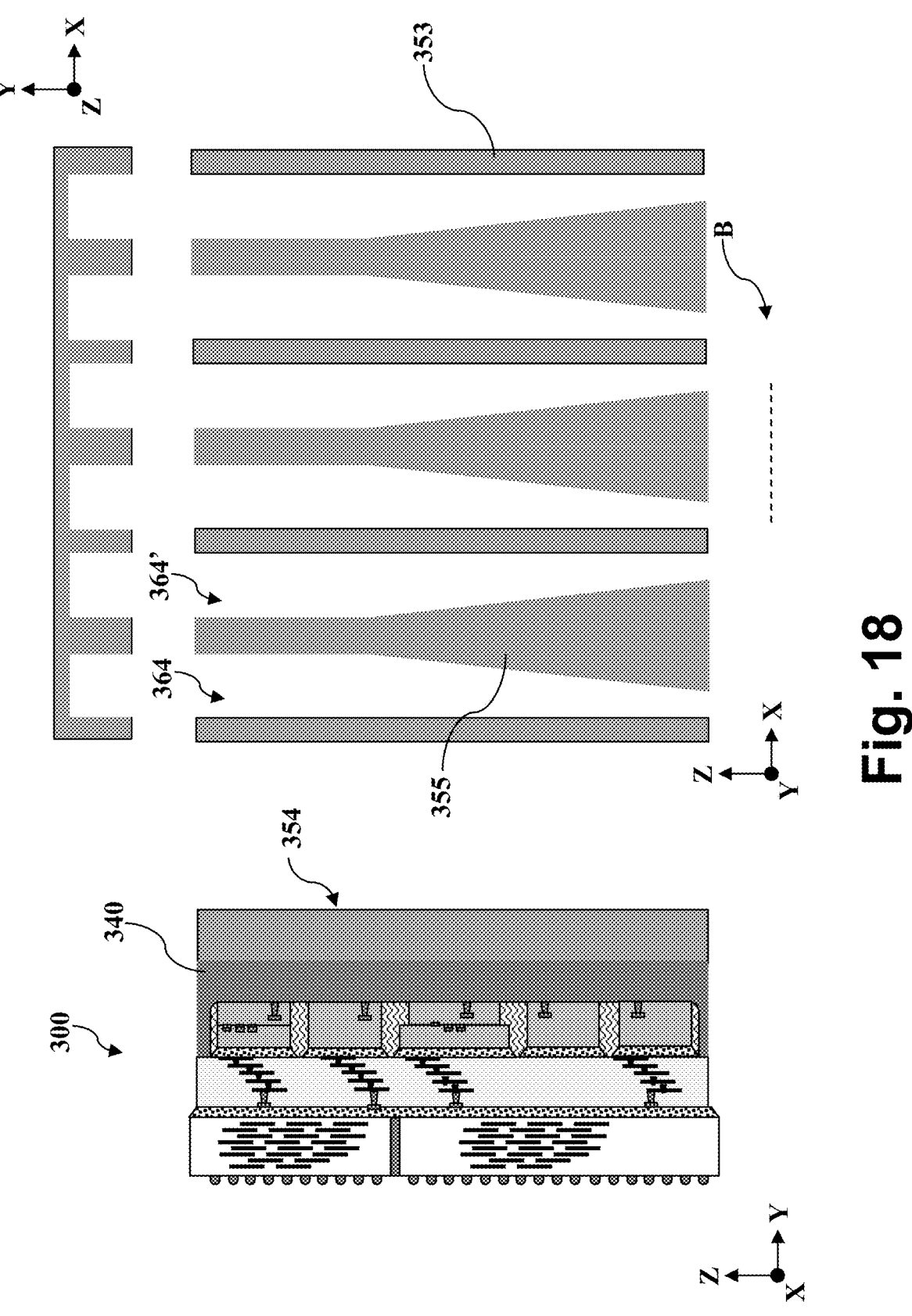

FIG. 18 illustrates a third heat sink 354 mounted on the molding layer 340. In some embodiments, the third heat sink 354 may include a highly thermally conductive materials such as copper, aluminum, aluminum nitride, or silicon carbide. As shown in FIG. 18, when viewed along the Y direction perpendicular to a primary surface of the device package 300, the third heat sink 354 includes straight fins 353 interleaved by sloped fins 355. The straight fins 353 and the interleaving sloped fins 355 define second sloped channels 364 and third sloped channels 364'. Each of the second sloped channel 364 is a mirror image of the third sloped channel 364'. Each of the second sloped channels 364 and the third sloped channel 364' has a smaller channel opening adjacent to the bottom surface B of the coolant tank 102 and a greater channel opening away from the bottom surface B. The sloped profile of the second sloped channels 364 and the third sloped channels 364' facilitate upward movement of the vapor bubbles, thereby improving heat exchange efficiency. FIG. 18 also illustrates a fragmentary top view of the third heat sink 354.

Figure 19:
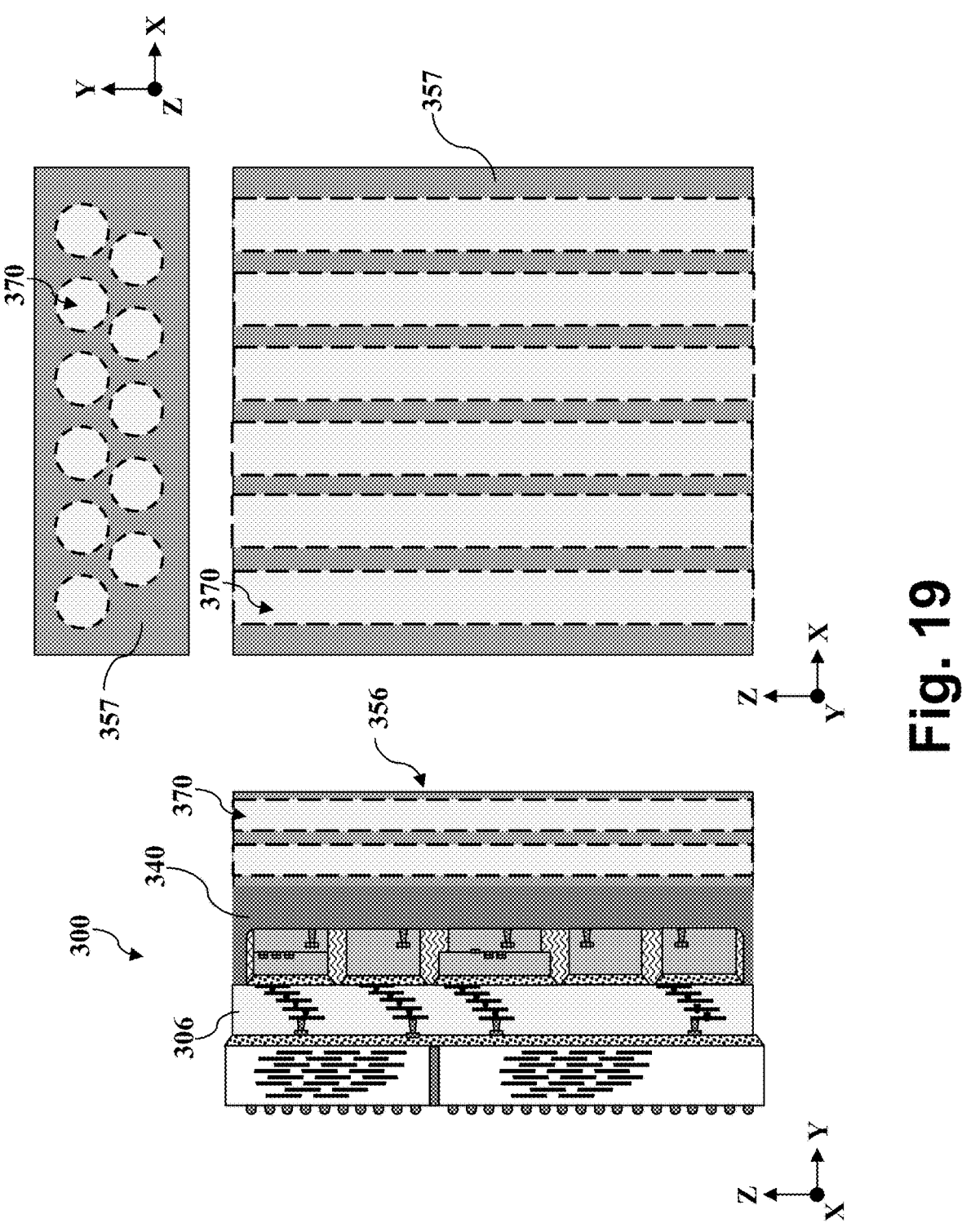

FIG. 19 illustrates a fourth heat sink 356 mounted on the molding layer 340. In some embodiments, the fourth heat sink 356 may include a highly thermally conductive materials such as copper, aluminum, aluminum nitride, or silicon carbide. As shown in FIG. 19, the fourth heat sink 356 includes a body 357 and a plurality of straight channels 370 extending through the body 357 along the Z direction. The straight channels 370 facilitate upward movement of the vapor bubbles, thereby improving heat exchange efficiency. FIG. 19 also illustrates a fragmentary top view of the fourth heat sink 356. In some embodiments, a thickness of the body 357 measured from the interposer 306 is sufficient to accommodate two arrays of the straight channels 370.

Figure 20:
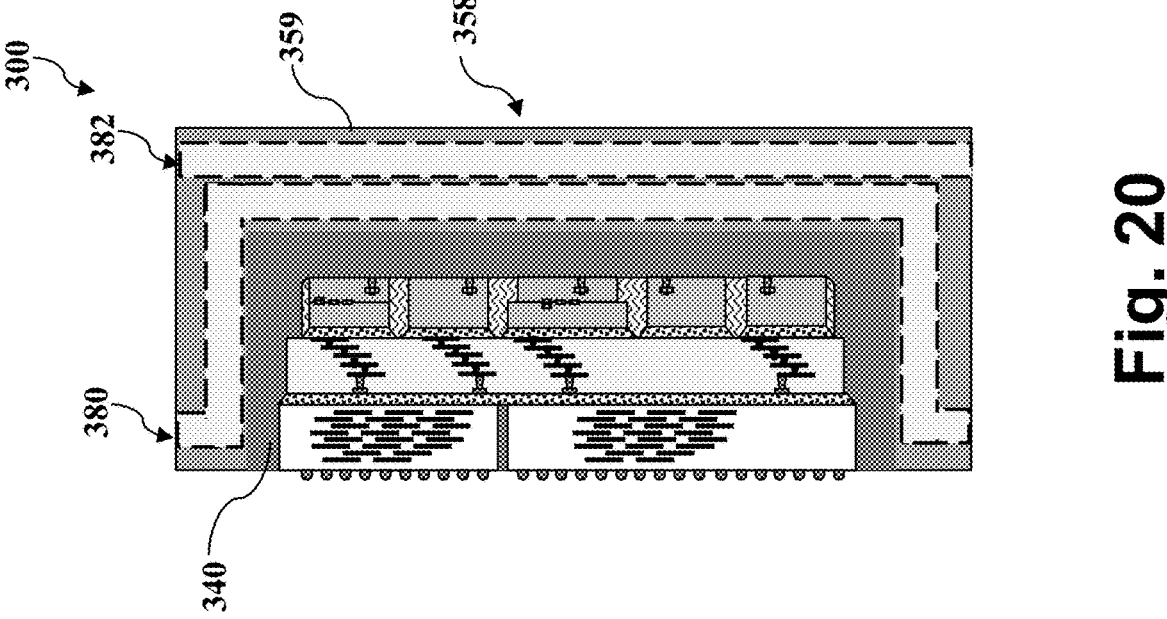

FIG. 20 illustrates a fifth heat sink 358 mounted on the molding layer 340. In some embodiments, the fifth heat sink 358 may include a highly thermally conductive materials such as copper, aluminum, aluminum nitride, or silicon carbide. As shown in FIG. 20, the molding layer 340 covers and insulates a top surface and sidewalls of the device package 300 and a body 359 of the fifth heat sink 358 also covers a top surface and sidewalls of the molding layer. A plurality of conformal channels 380 extends through the body 359 and tracks a profile of the molding layer 340. A plurality of straight channels 382 vertically extends through the body 359. The conformal channels 380 and the straight channels 382 facilitate upward movement of the vapor bubbles, thereby improving heat exchange efficiency.

Figure 21:
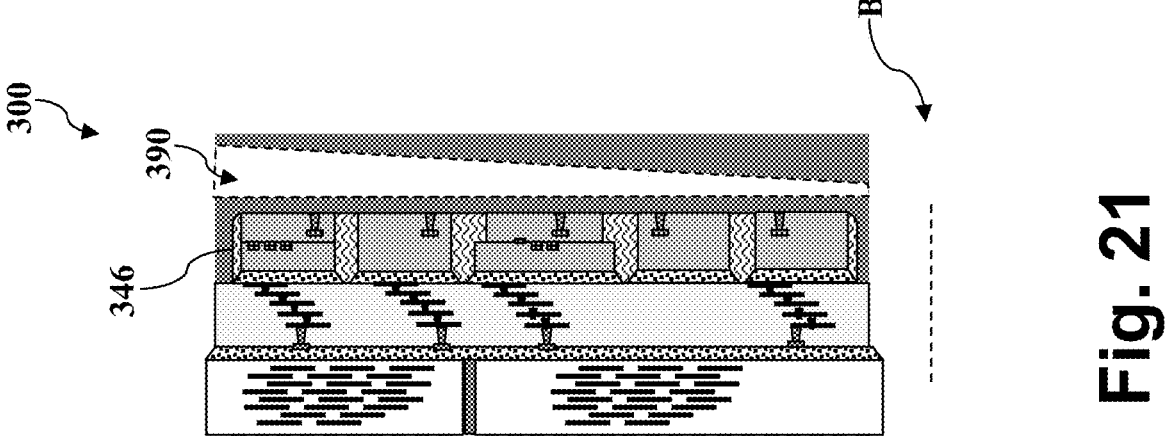
Figure 21:
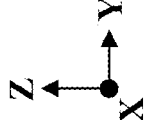

FIG. 21 illustrates a channeled molding layer 346 mounted on the molding layer 340. Different from the molding layer 340 shown in FIG. 15, the channeled molding layer 346 includes a sloped channel 390. Each of the sloped channels 390 has a smaller channel opening adjacent to the bottom surface B of the coolant tank 102 and a greater channel opening away from the bottom surface B. The sloped profile of the sloped channels 390 facilitate upward movement of the vapor bubbles, thereby improving heat exchange efficiency.

Figure 22:
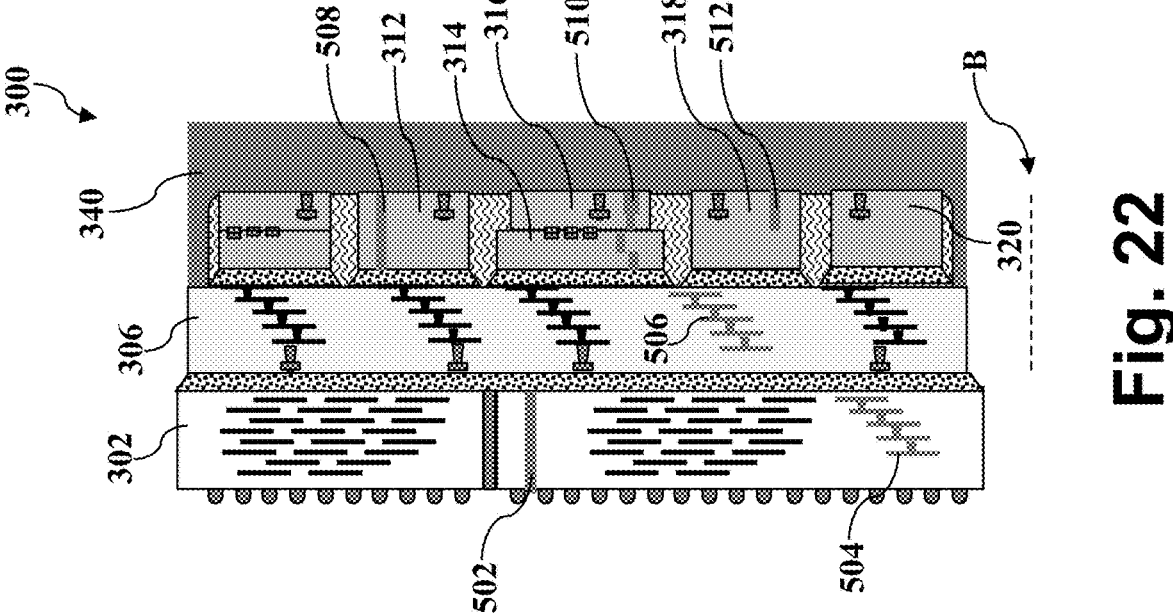

FIG. 22 illustrates a device package 300 that includes multiple dummy metal structures. Because metals are in general much more thermally conductive than polymers, such as polyimide and epoxy, inclusion of the dummy metal structure improves heat dissipation from the device package 300. As used herein a dummy metal structure refers to a metal feature that is not electrically coupled to any functional circuitry or is electrically floating. In some embodiments represented in FIG. 22, the package substrate 302 may include a dummy through insulation via (TIV) 502 and dummy conductive structure 504 that may include more than one contact vias and conductive lines. The interposer 306 may include a dummy build-up conductive feature 506. The first memory IC 312 may include a dummy through substrate via (TSV) 508. The first IC chip 314 and the second IC chip 316 may include a plurality of dummy vias 510. The third IC chip 318 may include a dummy via 512. The dummy metal structures shown in FIG. 22 may or may not include portions that are in direct contact with the coolant 104.

Figure 23:
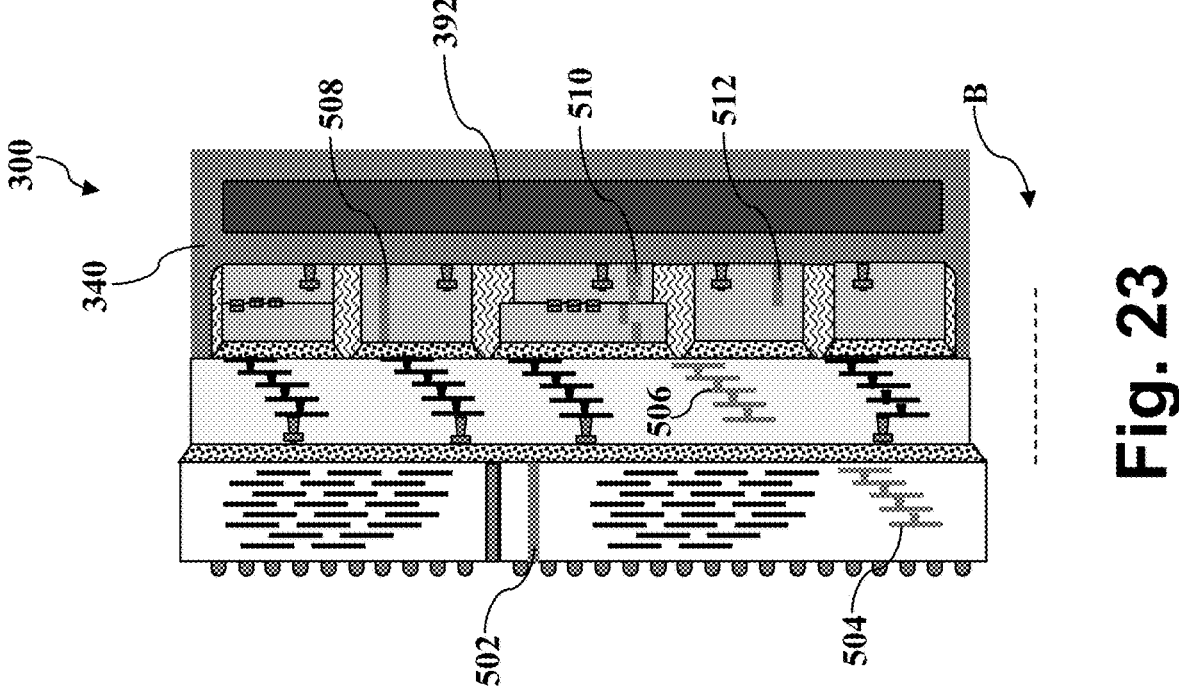

FIG. 23 illustrates a heat conductor plate 392 embedded in the molding layer 340. As described above, the molding layer 340 may include filler particles that are thermally conductive. In the same vein, the molding layer 340 may include a heat conductor plate 392 that is embedded in the molding layer 340. The heat conductor plate 392 may be electrically insulative or electrically conductive. Example electrically insulative heat conductor plate 392 may include aluminum oxide, boron nitride, zinc oxide, silicon, germanium, or aluminum nitride. Example electrically conductive heat conductor plate 392 may include graphite (an electrically conductive form of carbon), titanium, tantalum, aluminum, aluminum copper, aluminum silicon copper, copper, manganese, tungsten, zinc, or nickel. The inclusion of the heat conductor plate 392 may greatly increase the thermal conductivity of the molding layer 340. While thermal conductivity of the molding layer 340 may be maximized by maximizing the dimensions of heat conductor plate 392, it is best that the heat conductor plate 392 is completely encapsulated in the molding layer 340 to prevent undesirable delamination. Along the Z direction or the X direction, a dimension of the heat conductor plate 392 may be between about 20% and about 80% of that of the molding layer 340. A thickness of the heat conductor plate 392 along the Y direction may be between about 20% and about 80% of a thickness of the molding layer 340.

In one exemplary aspect, the present disclosure is directed to a cooling system. The cooling system includes a coolant tank containing a coolant, a cooling coil disposed within the coolant tank, a refrigerant circulating in the cooling coil, and a circulation pump disposed in the coolant tank and configured to circulate the coolant within the coolant tank.

In some embodiments, the cooling system may further include a temperature sensor disposed within the coolant tank and a management module electrically coupled to the temperature sensor and the circulation pump. In some embodiments, the management module is configured to provide a first power output to the circulation pump when the temperature sensor detects a temperature above a predetermined temperature, and provide a second power output to the circulation pump when the temperature sensor detects a temperature below the pre-determined temperature. The first power output is greater than the second power output. In some embodiments, the coolant is water. In some implementations, the refrigerant includes chlorofluorocarbons (CFCs), hydrochlorofluorocarbons (HCFCs), ammonia, water, carbon dioxide, a refrigerant-grade propane, or a refrigerant-grade isobutane. In some instances, the coolant tank includes a vent configured to release a pressure in the coolant tank when the pressure exceeds a pre-determined level. In some embodiments, the cooling system further includes a first compressor having a first inlet, a second compressor having a second inlet, and a three-way valve coupled to the cooling coil. The three-way valve is configured to switch between a first position where the first inlet is in fluid communication with the cooling coil and a second position where the second inlet is in fluid communication with the cooling coil. In some implementations, the cooling system may further include a coolant reservoir in fluid communication with the coolant tank by way of an inlet hose and an outlet hose.

In another exemplary aspect, the present disclosure is directed to a system. The system includes a coolant tank containing a coolant, a cooling coil disposed within the coolant tank, a refrigerant circulating in the cooling coil, a temperature sensor disposed within the coolant tank, and a circulation pump disposed in the coolant tank, a management module electrically coupled to the temperature sensor and the circulation pump, and a device package disposed within the coolant tank. The device package includes an external shield.

In some embodiments, wherein the temperature sensor is disposed within the external shield. In some implementations, the external shield includes a polymer matrix and thermally conductive particles embedded in the polymer matrix. The polymer matrix includes epoxy, polyimide, silicone resin, polyurethane, or polyacrylate. The thermally conductive particles include titanium, tantalum, aluminum, aluminum copper, aluminum silicon copper, copper, manganese, carbon, silicon, germanium, tungsten, zinc, or nickel. In some instances, the device package further includes a non-adhesion coating disposed over the external shield. In some embodiments, the non-adhesion coating includes polytetrafluoroethylene. In some implementations, the coolant includes water and the refrigerant includes chlorofluorocarbons (CFCs), hydrochlorofluorocarbons (HCFCs), ammonia, water, carbon dioxide, a refrigerant-grade propane, or a refrigerant-grade isobutane. In some instances, the device package further includes a metal plate embedded in the external shield and the metal plate is electrically floating.

In yet another exemplary aspect, the present disclosure is directed to a system. The system includes a coolant tank containing a coolant, a cooling coil disposed within the coolant tank, a refrigerant circulating in the cooling coil, a coolant resistance sensor disposed within the coolant tank, a circulation pump disposed in the coolant tank, and a management module coupled to the coolant resistance sensor and the circulation pump.

In some embodiments, the management module is configured to provide a first power output to the circulation pump when the coolant resistance sensor detects an electrical resistance smaller than a pre-determined resistance, and provide a second power output to the circulation pump when the coolant resistance sensor detects an electrical resistance greater than the pre-determined resistance. The first power output is greater than the second power output. In some implementations, the system may further include a device package including an external shield, and a temperature sensor embedded in the external shield. The temperature sensor is electrically couple to the management module. In some embodiments, the management module is configured to provide the first power output to the circulation pump when the temperature sensor detects a temperature above a pre-determined temperature. In some instances, the coolant is water, and the refrigerant includes chlorofluorocarbons (CFCs), hydrochlorofluorocarbons (HCFCs), ammonia, water, carbon dioxide, a refrigerant-grade propane, or a refrigerant-grade isobutane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cooling system, comprising:
a coolant tank containing a coolant;
a reservoir in fluid communication with the coolant tank via a tank inlet and a tank outlet;
a cooling coil disposed within the coolant tank and over the coolant;
a refrigerant circulating in the cooling coil;
a circulation pump disposed in the coolant tank and configured to circulate the coolant within the coolant tank;
a device package disposed in the coolant tank and comprising:
a package substrate,
an interposer over the package substrate, and
a plurality of integrated circuit dies over the interposer;

a molding layer covering a top surface and sidewalls of the device package; and
a heat sink covering a top surface and sidewalls of the molding layer,
wherein the reservoir is external to the coolant tank,
wherein the heat sink comprises a plurality of conformal channels and a plurality of straight channels,
wherein the plurality of conformal channels track a profile of the molding layer.

2. The cooling system of claim 1, further comprising:
a temperature sensor disposed within the coolant tank; and
a management module electrically coupled to the temperature sensor and the circulation pump.

3. The cooling system of claim 2, wherein the management module is configured to:
provide a first power output to the circulation pump when the temperature sensor detects a temperature above a pre-determined temperature; and
provide a second power output to the circulation pump when the temperature sensor detects a temperature below the pre-determined temperature,
wherein the first power output is greater than the second power output.

4. The cooling system of claim 1, wherein the coolant is water.

5. The cooling system of claim 4, wherein the refrigerant comprises chlorofluorocarbons (CFCs) or hydrochlorofluorocarbons (HCFCs).

6. The cooling system of claim 1, wherein the coolant tank comprises a vent configured to release a pressure in the coolant tank when the pressure exceeds a pre-determined level.

7. The cooling system of claim 1, further comprising:
a first compressor having a first inlet;
a second compressor having a second inlet; and
a three-way valve coupled to the cooling coil,
wherein the three-way valve is configured to switch between a first position where the first inlet is in fluid communication with the cooling coil and a second position where the second inlet is in fluid communication with the cooling coil.

8. The cooling system of claim 1, further comprising:
a heat exchanger mechanically coupled to the reservoir.

9. The cooling system of claim 1, wherein the heat sink comprises copper, aluminum, aluminum nitride, or silicon carbide.

10. A system, comprising:
a coolant tank containing a coolant;
a cooling coil disposed within the coolant tank;
a refrigerant circulating in the cooling coil;
a temperature sensor disposed within the coolant tank;
a circulation pump disposed in the coolant tank;
a management module electrically coupled to the temperature sensor and the circulation pump;
a device package disposed within the coolant tank and comprising:
a package substrate,
a silicon interposer over the package substrate,
a plurality of integrated circuit (IC) chips over the silicon interposer, and
an encapsulant disposed among the plurality of IC chips;
an external shield covering the plurality of IC chips, the encapsulant, sidewalls of the package substrate, and sidewalls of the silicon interposer; and a heat sink covering a top surface and sidewalls of the external shield, wherein the heat sink comprises a plurality of conformal channels that track a profile of the external shield.

11. The system of claim 10, wherein the external shield comprises a polymer matrix and thermally conductive particles embedded in the polymer matrix, wherein the polymer matrix comprises epoxy, polyimide, silicone resin, polyurethane, or polyacrylate, wherein the thermally conductive particles comprise titanium, tantalum, aluminum, aluminum copper, aluminum silicon copper, copper, manganese, carbon, silicon, silicon germanium, tungsten, zinc, or nickel.

12. The system of claim 10, wherein the coolant comprises water, wherein the refrigerant comprises chlorofluorocarbons (CFCs) or hydrochlorofluorocarbons (HCFCs).

13. The system of claim 10, wherein the heat sink further comprises a plurality of straight channels.

14. The system of claim 10, wherein the device package further comprises an underfill disposed between the package substrate and the silicon interposer.

15. The system of claim 10, wherein the plurality of IC chips comprise at least a photonic IC chip, an electronic IC chip, and a memory IC chip.

16. A system, comprising:

a coolant tank containing a coolant;

a reservoir external to the coolant tank;

a cooling coil disposed within the coolant tank and over the coolant;

a refrigerant circulating in the cooling coil;

a coolant resistance sensor disposed within the coolant tank;

a circulation pump disposed in the coolant tank;

a management module coupled to the coolant resistance sensor and the circulation pump;

a device package immersed in the coolant and comprising:

a package substrate, an interposer bonded to the package substrate by way of bumps, and a plurality of integrated circuit (IC) chips over the interposer;

an external shield covering the plurality of IC chips, sidewalls of the package substrate, and sidewalls of the interposer; and a heat sink covering a top surface and sidewalls of the external shield, wherein the reservoir is in fluid communication with the coolant tank by way of an inlet and an outlet such that the coolant in the coolant tank is drainable to the reservoir, wherein the heat sink comprises a plurality of conformal channels that track a profile of the external shield, wherein the heat sink comprises copper, aluminum, aluminum nitride, or silicon carbide.

17. The system of claim 16, wherein the management module is configured to:

provide a first power output to the circulation pump when the coolant resistance sensor detects an electrical resistance smaller than a pre-determined resistance; and provide a second power output to the circulation pump when the coolant resistance sensor detects an electrical resistance greater than the pre-determined resistance, wherein the first power output is greater than the second power output.

18. The system of claim 16, wherein the coolant is water, and wherein the refrigerant comprises chlorofluorocarbons (CFCs), hydrochlorofluorocarbons (HCFCs), ammonia, water, carbon dioxide, a refrigerant-grade propane, or a refrigerant-grade isobutane.

19. The system of claim 16, wherein the device package further comprises an encapsulant surrounding sidewalls of the plurality of IC chips.

20. The system of claim 16, wherein the plurality of IC chips comprise at least a photonic IC chip, an electronic IC chip, and a memory IC chip.

* * * * *